US 8,867,259 B2

(12) United States Patent
Kawai et al.

(10) Patent No.: US 8,867,259 B2
(45) Date of Patent: Oct. 21, 2014

(54) METHOD OF PROGRAMMING VARIABLE RESISTANCE NONVOLATILE MEMORY ELEMENT

(75) Inventors: Ken Kawai, Osaka (JP); Kazuhiko Shimakawa, Osaka (JP); Yoshikazu Katoh, Osaka (JP); Shunsaku Muraoka, Osaka (JP)

(73) Assignee: Panasonic Corporation, Osaka (JP)

( * ) Notice: Subject to any disclaimer, the term of this patent is extended or adjusted under 35 U.S.C. 154(b) by 169 days.

(21) Appl. No.: 13/704,649

(22) PCT Filed: Aug. 9, 2012

(86) PCT No.: PCT/JP2012/005067
§ 371 (c)(1),
(2), (4) Date: Dec. 17, 2012

(87) PCT Pub. No.: WO2013/021648
PCT Pub. Date: Feb. 14, 2013

(65) Prior Publication Data
US 2013/0148408 A1 Jun. 13, 2013

(30) Foreign Application Priority Data
Aug. 11, 2011 (JP) .................................. 2011-176432

(51) Int. Cl.
*G11C 11/00* (2006.01)
*G11C 13/00* (2006.01)

(52) U.S. Cl.
CPC .... *G11C 13/0069* (2013.01); *G11C 2013/0083* (2013.01); *G11C 2013/0073* (2013.01); *G11C 2013/0054* (2013.01); *G11C 13/0064* (2013.01); *G11C 2013/0092* (2013.01); *G11C 13/0007* (2013.01); *G11C 2213/56* (2013.01); *G11C 2213/79* (2013.01); *G11C 13/004* (2013.01)

USPC .......................................... 365/148; 365/163

(58) Field of Classification Search
USPC ........................................ 365/148, 163, 171
See application file for complete search history.

(56) References Cited

U.S. PATENT DOCUMENTS 6,075,719 A  6/2000 Lowrey et al.
7,583,525 B2  9/2009 Shiimoto et al.
(Continued)

FOREIGN PATENT DOCUMENTS

JP  2006-351780  12/2006
JP  2007-004849  1/2007
(Continued)

OTHER PUBLICATIONS

International Search Report issued Sep. 11, 2012 in International (PCT) Application No. PCT/JP2012/005067.
(Continued)

*Primary Examiner* — Vu Le
(74) *Attorney, Agent, or Firm* — Wenderoth, Lind & Ponack, LLP.

(57) ABSTRACT

A method of programming a variable resistance nonvolatile memory element that removes a defect in a resistance change, ensures an operation widow, and stably sustains a resistance change operation, the method including: applying, when the detect in the resistance change occurs in the variable resistance nonvolatile memory element, a recovery voltage pulse at least once to the variable resistance nonvolatile memory element, the recovery voltage pulse including: a first recovery voltage pulse that has an amplitude greater than amplitudes of a normal high resistance writing voltage pulse and a low resistance writing voltage pulse; and a second recovery voltage pulse that is the low resistance writing voltage pulse following the first recovery voltage pulse.

14 Claims, 13 Drawing Sheets

(56) References Cited

U.S. PATENT DOCUMENTS

| | | | |
|---|---|---|---|
| 8,022,502 | B2 | 9/2011 | Kanzawa et al. |
| 8,094,485 | B2 * | 1/2012 | Shimakawa et al. .......... 365/148 |
| 2007/0247894 | A1 | 10/2007 | Shiimoto et al. |
| 2009/0283736 | A1 | 11/2009 | Kanzawa et al. |
| 2010/0207094 | A1 | 8/2010 | Kanzawa et al. |
| 2010/0271860 | A1 | 10/2010 | Muraoka et al. |
| 2011/0294259 | A1 | 12/2011 | Kanzawa et al. |

FOREIGN PATENT DOCUMENTS

| | | |
|---|---|---|
| JP | 2007-004935 | 1/2007 |
| JP | 2007-294592 | 11/2007 |
| WO | 2008/149484 | 12/2008 |
| WO | 2009/050833 | 4/2009 |
| WO | 2009/145308 | 12/2009 |
| WO | 2010/038442 | 4/2010 |

OTHER PUBLICATIONS

I. G. Baek et al., "Highly Scalable Non-volatile Resistive Memory using Simple Binary Oxide Driven by Asymmetric Unipolar Voltage Pulses", IEEE International Electron Devices Meeting, IEDM Technical Digest, Dec. 13-15, 2004, p. 587 (Fig. 5(b)).

An Office Action issued Jul. 23, 2014 in corresponding Chinese Patent Application No. 201280001689.9 (with partial English translation).

* cited by examiner (a) Before application of recovery voltage pulse (b) After application of recovery voltage pulse

FIG. 10

| Operation | Normal operation | | | By function recovery of conductive path | | LR writing recovery operation | By re-breakdown | |
|---|---|---|---|---|---|---|---|---|
| Applied voltage pulse | HR writing | LR writing | Normal reading | First recovery | Second recovery | LR writing verify reading | First re-breakdown | Second re-breakdown | Reading after re-breakdown |
| WL | VL | VL | VDD | Vrch | Vrcl | VDD | Vbrh | Vbrl | VDD |
| SL | 0 V | VL | 0 V | 0 V | Vrcl | 0 V | 0 V | Vbrl | 0 V |
| BL | VH / 0 V | VL / 0 V | Vread | Vrch / 0 V | Vrcl / 0 V | Vread | Vbrh / 0 V | Vbrl / 0 V | Vread |

METHOD OF PROGRAMMING VARIABLE RESISTANCE NONVOLATILE MEMORY ELEMENT

TECHNICAL FIELD

The present invention relates to a method of programming a variable resistance nonvolatile memory element for use in stably sustaining a resistance change of the variable resistance nonvolatile memory element whose resistance value reversibly changes based on electrical signals.

BACKGROUND ART

In recent years, variable resistance nonvolatile memory devices (hereinafter, also simply referred to as "nonvolatile memory devices") having memory cells including variable resistance nonvolatile memory elements (hereinafter, also simply referred to as "variable resistance elements") have been researched and developed. The variable resistance elements are elements that have characteristics in which a resistance value reversibly changes based on electrical signals and are capable of holding data corresponding to the resistance value in a nonvolatile manner.

Commonly known as a nonvolatile memory device including variable resistance elements is a nonvolatile memory device including a matrix of so-called 1T1R memory cells in each of which a MOS transistor and a variable resistance element are connected in series with each other at a location close to a cross-point between a bit line and a word line that are arranged perpendicular to each other. In each of the 1T1R memory cells, the variable resistance element has one of terminals connected to the bit line or a source line, and the other terminal connected to a drain or source of the MOS transistor. The transistor has a gate connected to the word line. The transistor has the other terminal connected to the source line or bit line that is not connected to the other terminal of the variable resistance element. The source line is arranged parallel to the bit line or the word line.

Also generally known as another memory cell structure is a nonvolatile memory device including a matrix of cross point memory cells called 1D1R memory cells in each of which a diode and a variable resistance element are connected in series with each other at a cross-point between a bit line and a word line that are arranged perpendicular to each other.

The following describes typical conventional variable resistance elements.

Non Patent Literature (NPL) 1 discloses a nonvolatile memory including 1T1R memory cells each using a transition metal oxide as a variable resistance to element. NPL 1 recites that in order to allow a resistance value of a transition metal oxide thin film, generally an insulator, to be changed by application of an electrical pulse, it is necessary to perform forming processing to form a conductive path for switching the variable resistance element between a high resistance state and a low resistance state.

FIG. 13 is a graph showing a dependency of a forming voltage (V_form) on a transition metal oxide film thickness (TMO Thickness) that is disclosed in NPL 1. The graph shows four property types of NiO, $TiO_7$, $HfO_2$, and $ZrO_2$ as transition metal oxides. A necessary forming voltage depends on the types of the transition metal oxides, and increases as a transition metal oxide has a greater film thickness. As a result, in order to reduce a forming voltage, a transition metal oxide such as MO is selected and the film thickness of the transition metal oxide is decreased, for example.

Patent Literature (PTL) 1 discloses a nonvolatile memory including ion conductive variable resistance elements each of which includes an insulator film (amorphous $Gd_2O_3$) and a conductive film (CuTe).

FIG. 14 is a schematic cross-section view of a variable resistance element disclosed in PTL1.

A variable resistance element 5 has a stack structure in which a conductive film 3 and an insulator film 4 are disposed between electrodes 1 and 2. PTL 1 discloses that examples of a material of the conductive film 3 include a metal film including at least one metal element selected from among Cu, Ag, and Zn, an alloy film (e.g., CuTe alloy film), and a metal compound film, and that examples of a material of the insulator film 4 include amorphous $Gd_2O_3$ and an insulator such as $SiO_2$.

In regard to programming the variable resistance element 5, when a voltage causing an electric potential of the first electrode 1 to be lower than that of the second electrode 2 is applied, ions of the metal enter the insulator film 4 by being pulled toward the electrode 2. When the ions reaches the electrode 2, the electrodes 1 and 2 are conducted, and the variable resistance element 5 changes to a low resistance state (LR writing). In this way, writing data into the variable resistance element 5 (LR writing) is performed. Conversely, when a voltage causing the electric potential of the electrode 1 to be higher than that of the electrode 2, the metal element is ionized, and ions of the metal element come out of the insulator film 4 by being pulled toward the electrode 1. As a result, insulating properties between the electrodes 1 and 2 increase, and the variable resistance element 5 changes to a high resistance state (HR writing). In this way, erasing data from the variable resistance element 5 (HR writing) is performed.

Each of (*a*) and (*b*) in FIG. 15 is a wave form chart of a voltage pulse applied to the variable resistance element 5 when data recording is performed once.

(*a*) in FIG. 15 shows a pulse wave form when writing (recording of data indicating "1") is performed. An erase voltage pulse PE is first applied as a voltage pulse having a reverse polarity, and a voltage pulse PW having a polarity corresponding to the data to be recorded is subsequently applied. In other words, a voltage pulse P1 for recording the data indicating "1" includes a set of the voltage pulses PE and PW.

(*b*) in FIG. 15 shows a pulse wave form when erasing (recording of data indicating "0") is performed. A write voltage pulse PW is first applied as a voltage pulse having a reverse polarity, and a voltage pulse PE having a polarity corresponding to the data to be recorded is subsequently applied. In other words, a voltage pulse P0 for recording the data indicating "0" includes a set of the voltage pulses PW and PE.

Recording data into the variable resistance element 5 by using the voltage pulses P1 and P0 shown in (*a*) and (*b*) in FIG. 15 limits the number of times the voltage pulse PW or PE having the same polarity succeeds one after another, to two or less. With this, it is possible to control a change of a resistance value of the variable resistance element 5 (an increase of a resistance value from LR state or a decrease of a resistance value from HR state) which is caused by successive application of the voltage pulse PW or PE having the same polarity many times, thereby extending an operating life.

CITATION LIST

Patent Literature

[PTL 1]
Japanese Unexamined Patent Application Publication No. 2007-4935 (FIG. 1, FIG. 2)

[PTL 2]
International Publication WO 2008/149484
[PTL 3]
International Publication WO 2009/050833

Non Patent Literature

[NPL 1]
I. G. Back et al., IEDM 2004, p. 587 (FIG. 5(*b*))

SUMMARY OF INVENTION

Technical Problem

The following summarizes the disclosures of the conventional techniques. NPT 1 discloses that applying an electric pulse to some of transition metal oxides causes a reversible, nonvolatile resistance change phenomenon and that in order to achieve a state where the resistance change phenomenon can occur, it is necessary to apply in advance a voltage having an absolute value larger than that of a voltage applied to cause a reversible resistance change after the state is achieved. In this DESCRIPTION, hereinafter, an operation to apply such a voltage is referred to as initial breakdown, and a voltage applied in the initial breakdown is referred to as an initial breakdown voltage.

NPT 1 discloses that an initial breakdown mechanism can be explained by a model in which a conductive path that enables a reversible resistance change is formed for a transition metal oxide in a significantly high resistance state similar to an initial insulating state.

PTL 1 discloses a data recording method that makes it possible to extend the operating life of a variable resistance element by applying, before a voltage having one of polarities that corresponds to data to be recorded is applied to the variable resistance element, a voltage having the other polarity to the variable resistance element.

It is expected to configure a more high-speed memory by using, as memory cells, variable resistance elements including the variable resistance element, in comparison with a commonly-known nonvolatile memory such as a flash memory.

However, although when a high resistance writing voltage pulse (once) and a low resistance writing voltage pulse (once) are alternately applied in each of the memory cells using the variable resistance elements, a resistance change occurs stably in an early stage of a series of programming operations, a resistance change state becomes more unstable as more programming operations are performed.

The present invention has been conceived to solve the problem, and an object of the present invention is to provide a method of programming a variable resistance nonvolatile memory element, for use in addressing an unstable resistance change phenomenon conventionally occurring, ensuring an operation window, and stably sustaining a resistance change operation.

Solution to Problem

In order to solve the problem, a method of programming a variable resistance nonvolatile memory element according to an aspect of the present invention is a method of programming a variable resistance nonvolatile memory element, the method of programming reversibly changing, by applying a voltage pulse to the variable resistance nonvolatile memory element, a resistance state of the variable resistance nonvolatile memory element, wherein the variable resistance nonvolatile memory element includes: a first electrode; a second electrode; and an oxygen-deficient transition metal oxide layer provided between the first and second electrodes, the transition metal oxide layer includes: a first transition metal oxide layer that is in contact with the first electrode; and a second transition metal oxide layer that is in contact with the second electrode and has a degree of oxygen deficiency lower than a degree of oxygen deficiency of the first transition metal oxide layer, and after the variable resistance nonvolatile memory element is manufactured and an initial breakdown voltage pulse having a predetermined amplitude is applied between the first and second electrodes, the variable resistance nonvolatile memory element has characteristics of (i) changing to a low resistance state when a low resistance writing voltage pulse for providing a negative electric potential to the second electrode with respect to the first electrode is applied, and (ii) changing to a high resistance state when a high resistance writing voltage pulse for providing a positive electric potential to the second electrode with respect to the first electrode is applied, the high resistance state being higher in resistance value than the low resistance state, the method of programming including, in the case where the variable resistance nonvolatile memory element cannot change to the low resistance state and remains in the high resistance state when the low resistance writing voltage pulse is applied to the variable resistance nonvolatile memory element, applying a recovery voltage pulse to the variable resistance nonvolatile memory element at least once, the recovery voltage pulse including: a first recovery voltage pulse that has an amplitude greater than an amplitude of the high resistance writing voltage pulse and provides the positive electric potential to the second electrode with respect to the first electrode; and a second recovery voltage pulse that follows the first recovery voltage pulse and provides the negative electric potential to the second electrode with respect to the first electrode.

Moreover, the method of programming a variable resistance nonvolatile memory element may include: determining whether or not the variable resistance nonvolatile memory element has changed to the low resistance state by the application of the second recovery voltage pulse; and repeating the applying of a recovery voltage pulse and the determining until the variable resistance nonvolatile memory element changes to the low resistance state.

Furthermore, the method of programming a variable resistance nonvolatile memory element may include applying a first re-breakdown voltage pulse to the variable resistance nonvolatile memory element at least once when the variable resistance nonvolatile memory element does not change to the low resistance state even after the applying of a recovery voltage pulse and the determining are repeated a predetermined number of times, the first re-breakdown voltage pulse having an amplitude greater than an amplitude of the first recovery voltage pulse.

Moreover, the method of programming a variable resistance nonvolatile memory element may include applying a breakdown voltage pulse to the variable resistance nonvolatile memory element at least once when the variable resistance nonvolatile memory element does not change to the low resistance state even after the applying of a recovery voltage pulse and the determining are repeated a predetermined number of times, the breakdown voltage pulse including: a first re-breakdown voltage pulse that has an amplitude greater than an amplitude of the first recovery voltage pulse; and a second re-breakdown voltage pulse that follows the first re-breakdown voltage pulse and provides the negative electric potential to the second electrode with respect to the first electrode.

Furthermore, in the method of programming a variable resistance nonvolatile memory element, the second recovery voltage pulse may have an amplitude less than or equal to an amplitude of the low resistance writing voltage pulse.

Moreover, in the method of programming a variable resistance nonvolatile memory element, the first recovery voltage pulse may have a pulse width greater than a pulse width of the second recovery voltage pulse.

Furthermore, in a variable resistance nonvolatile memory element that the method of programming is applied, the first transition metal oxide layer may be a layer having a composition expressed as $TaO_x$, and the second transition metal oxide layer may be a layer having a composition expressed as $TaO_y$, where x<y.

The present invention is realized not only as the method of programming a variable resistance nonvolatile memory element but also as a variable resistance nonvolatile memory device including a drive circuit that performs the method of programming.

Advantageous Effects of Invention

The method of programming a variable resistance nonvolatile memory element according to the present invention ensures an appropriate operation window even when the number of programming operations increases, thereby significantly enhancing the reliability of the nonvolatile memory device.

Figure 1:
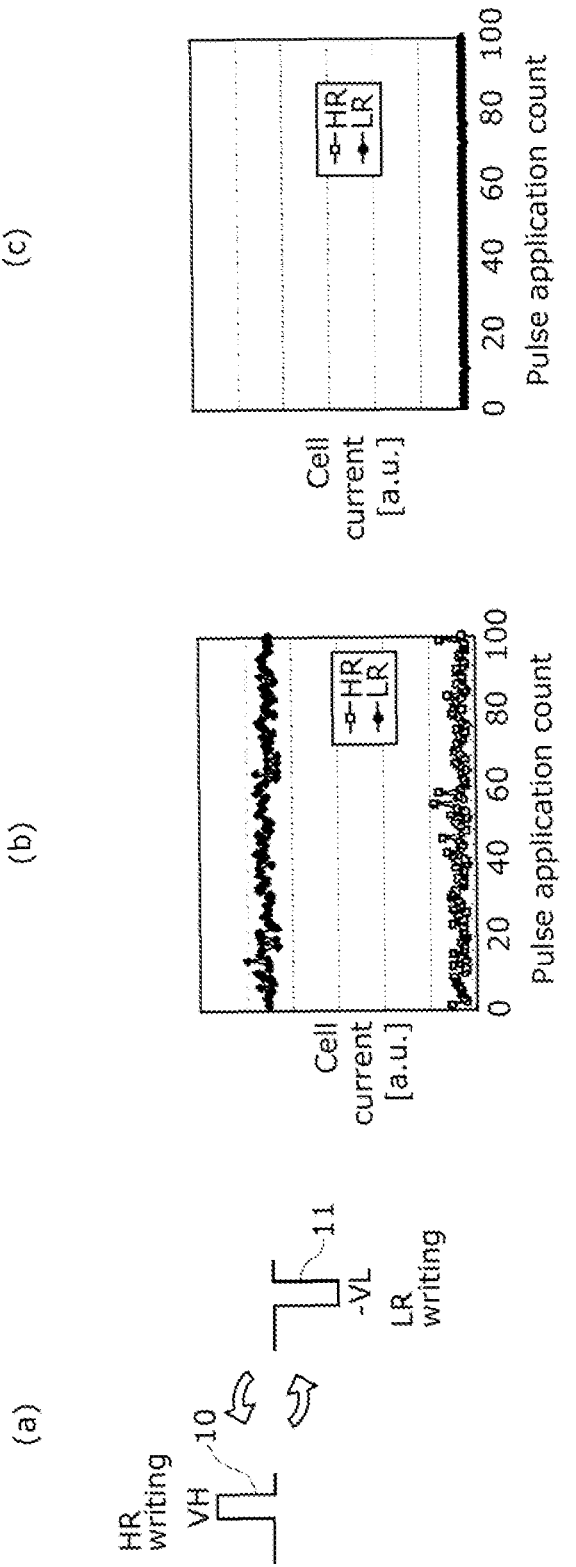
[FIG. 1]

(a) in FIG. 1 is a schematic view of a pulse wave form when a high resistance (HR) writing voltage pulse (1 pulse) and a low resistance (LR) writing voltage pulse (1 pulse) in the present invention are alternately applied; (b) in FIG. 1 is a normal resistance change characteristic graph when the high resistance writing voltage pulse and the low resistance writing voltage pulse shown in (a) are alternately applied; and (c) in FIG. 1 is an abnormal resistance change characteristic graph when high resistance continuance occurs.

[FIG. 2]

Figure 2:
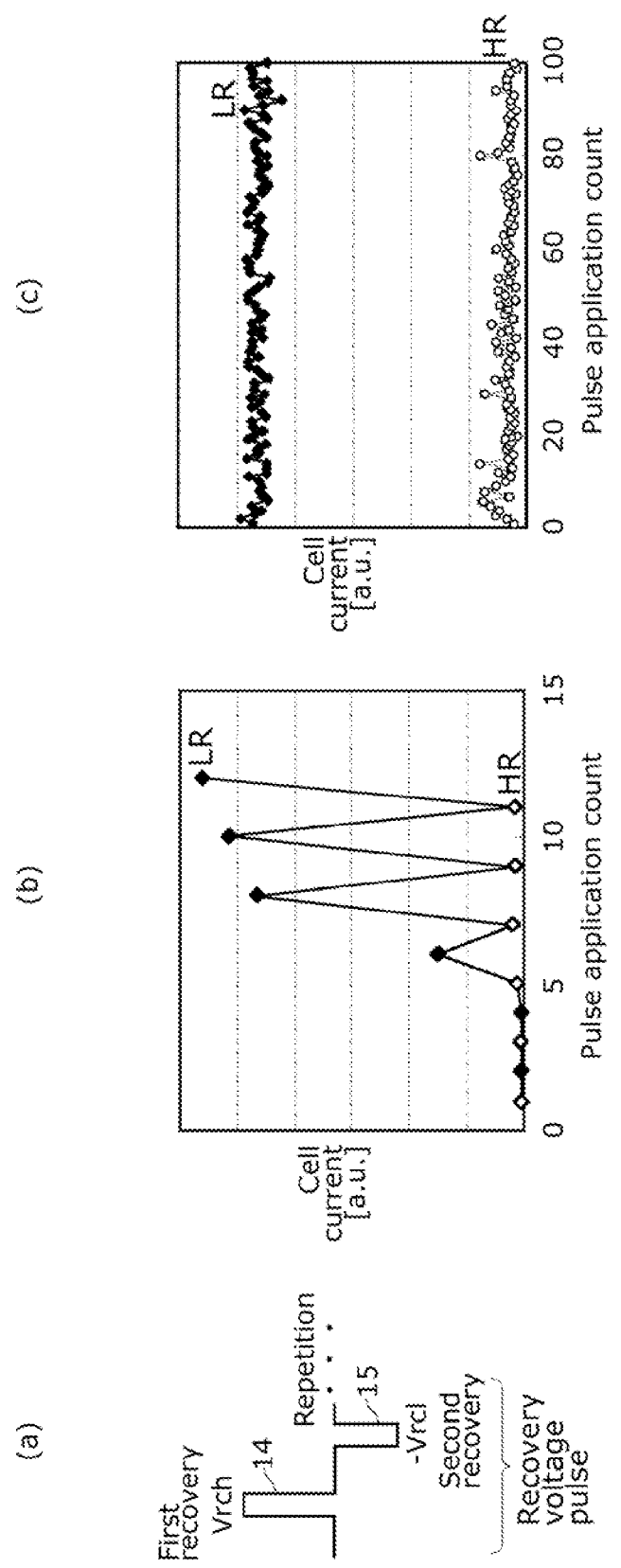

(a) in FIG. 2 is a schematic view of a pulse wave form when a high resistance (HR) writing voltage pulse and a low resistance (LR) writing voltage pulse in the present invention are alternately applied; (b) in FIG. 2 is a characteristic graph for recovery from high resistance state (HR) continuance when the high resistance writing voltage pulse and the low resistance writing voltage pulse shown in (a) are alternately applied; and (c) in FIG. 2 is a normal resistance change characteristic graph after the HR continuance is solved.

[FIG. 3]

Figure 3:
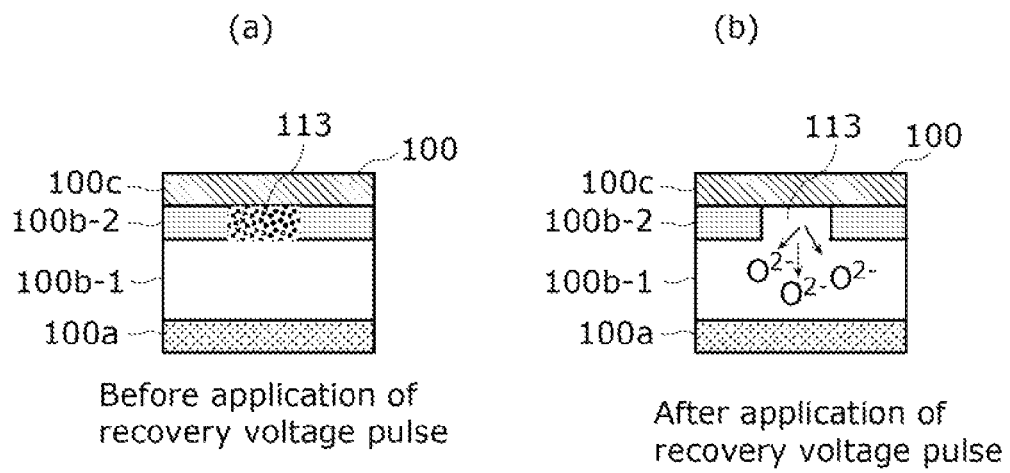

Each of (a) and (b) in FIG. 3 is a schematic diagram fosr an estimation mechanism of a recovery from HR continuance by application of a recovery voltage pulse in the present invention.

[FIG. 4]

Figure 4:
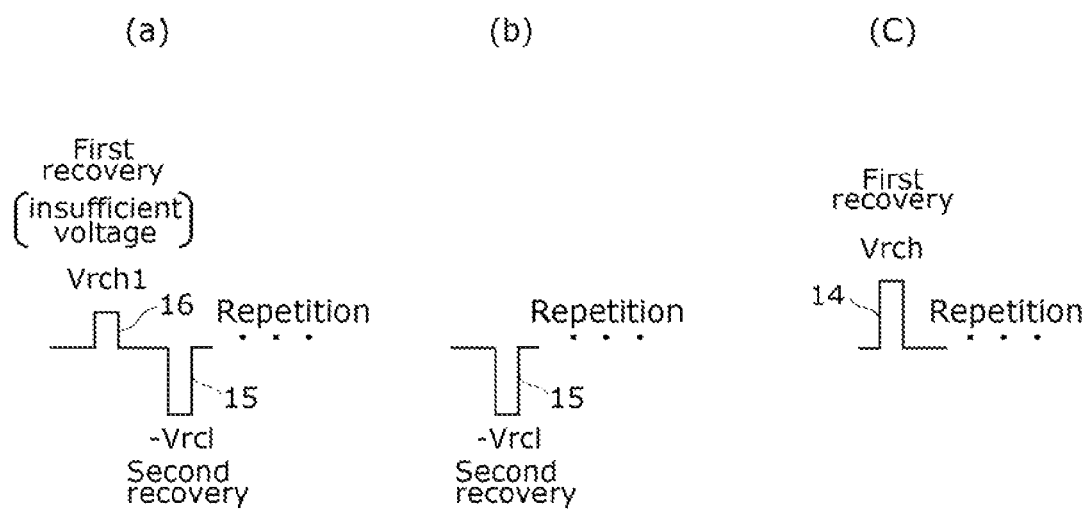

(a) in FIG. 4 is a schematic view of a pulse wave form when a first recovery voltage pulse that is deficient in voltage and a second recovery voltage pulse in a comparison example of the present invention are alternately applied; (b) in FIG. 4 is a schematic view of a pulse wave form when only the second recovery voltage pulse is successively applied; and (c) in FIG. 4 is a schematic view of a pulse wave form when only the first recovery voltage pulse is successively applied.

[FIG. 5]

Figure 5:
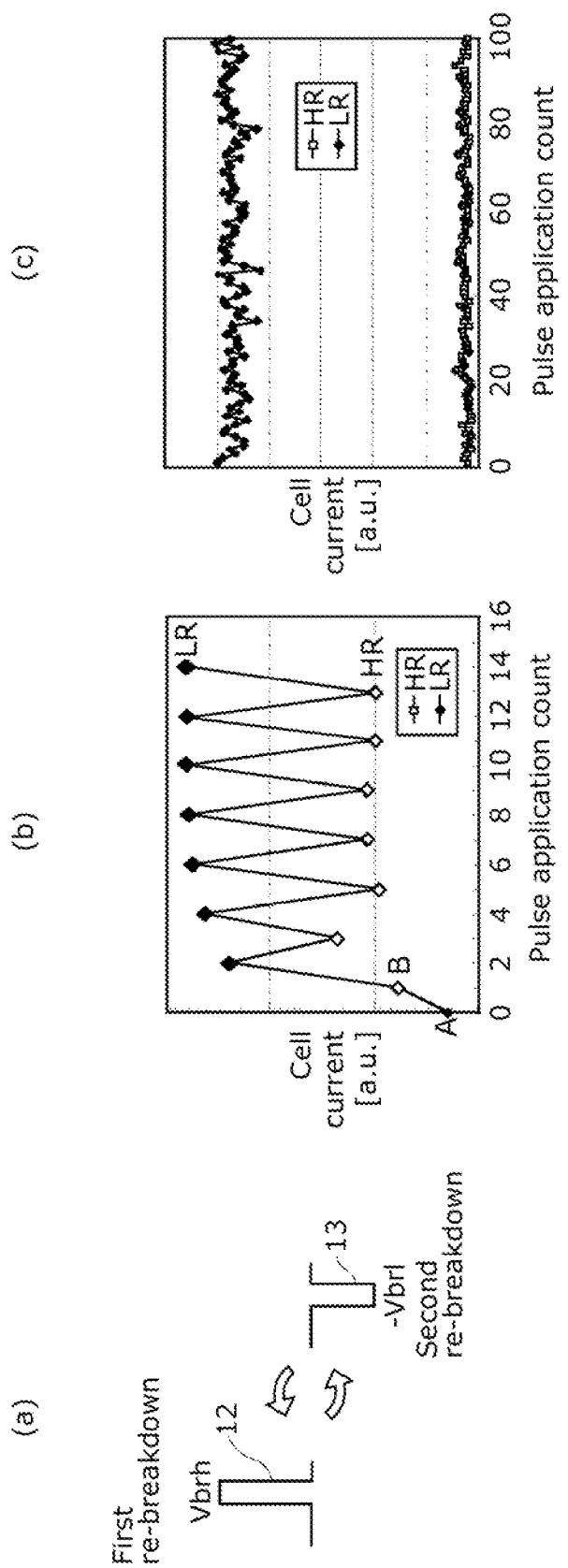

(a) in FIG. 5 is a schematic view of a pulse wave form when a high resistance (HR) writing voltage pulse and a low resistance (LR) writing voltage pulse in the present invention are alternately applied; (b) in FIG. 5 is a characteristic graph for recovery from high resistance state (HR) continuance when the high resistance writing voltage pulse and the low resistance writing voltage pulse shown in (a) are alternately applied; and (c) in FIG. 5 is a normal resistance change characteristic graph after the HR continuance is solved.

[FIG. 6]

Figure 6:
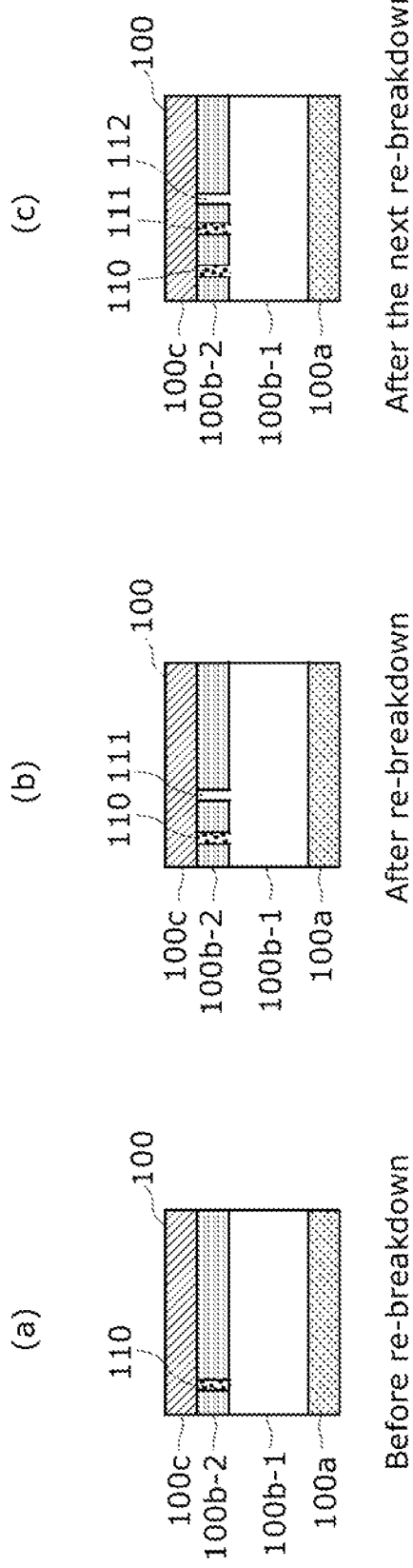

Each of (a) to (c) in FIG. 6 is a schematic diagram for an estimation mechanism of a recovery from HR continuance by re-breakdown in the present invention.

[FIG. 7]

Figure 7:
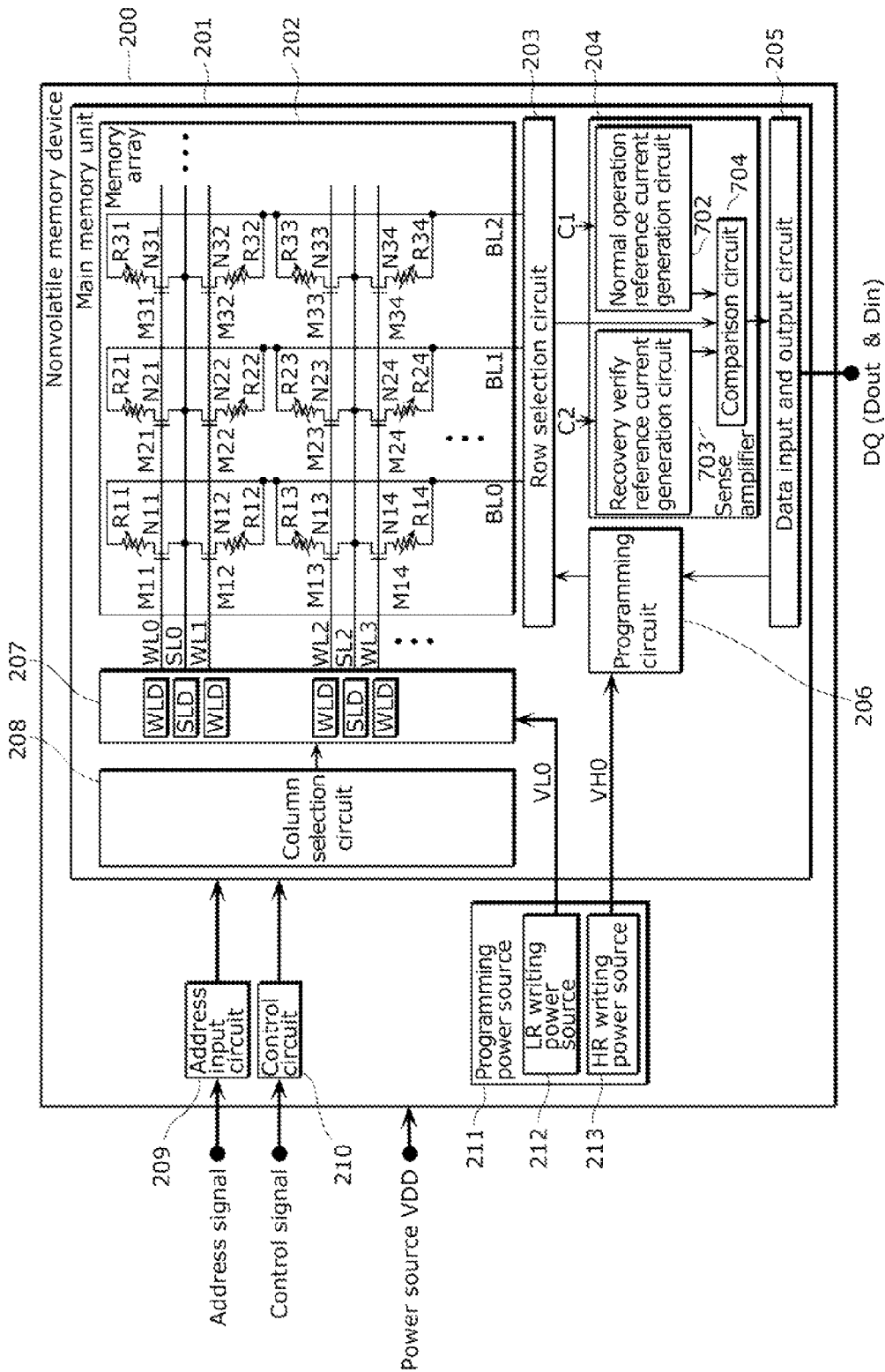

FIG. 7 is a block diagram of a variable resistance nonvolatile memory device according to an embodiment of the present invention.

[FIG. 8]

Figure 8:
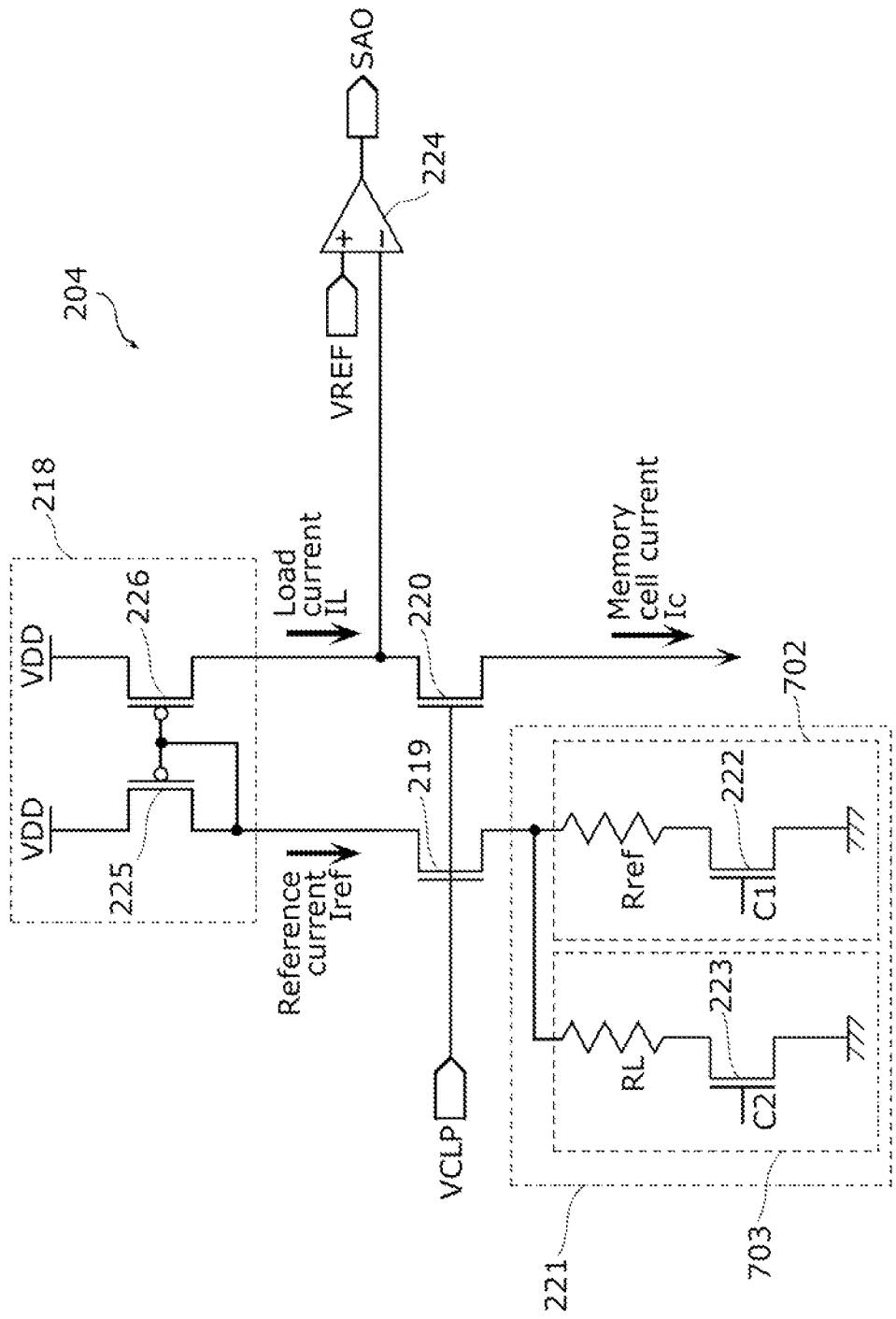

FIG. 8 is a circuit diagram showing an exemplary configuration of a sense amplifier according to an embodiment of the present invention.

[FIG. 9]

Figure 9:
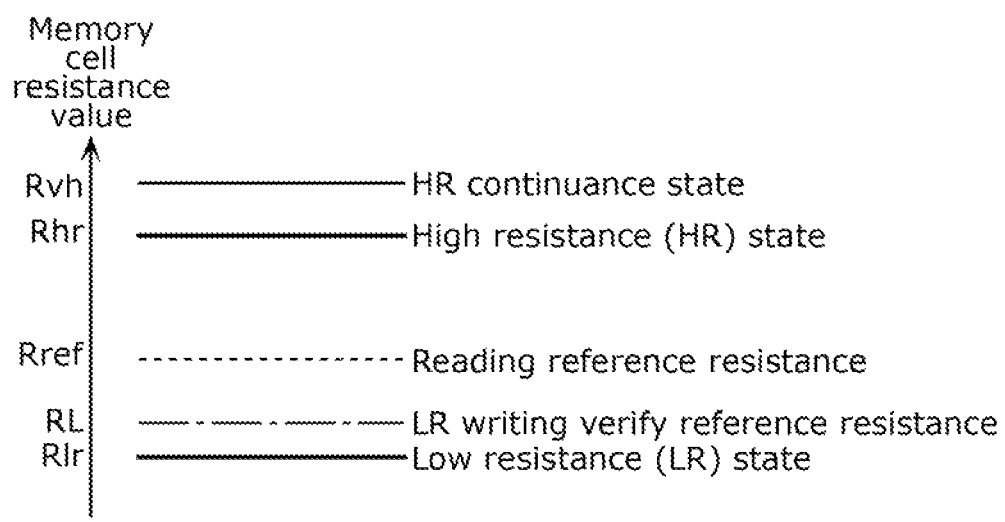

FIG. 9 is a diagram illustrating sense amplifier determination levels according to an embodiment of the present invention.

[FIG. 10]

FIG. 10 is a table illustrating a setting voltage in each operation according to an embodiment of the present invention.

[FIG. 11]

Figure 11:
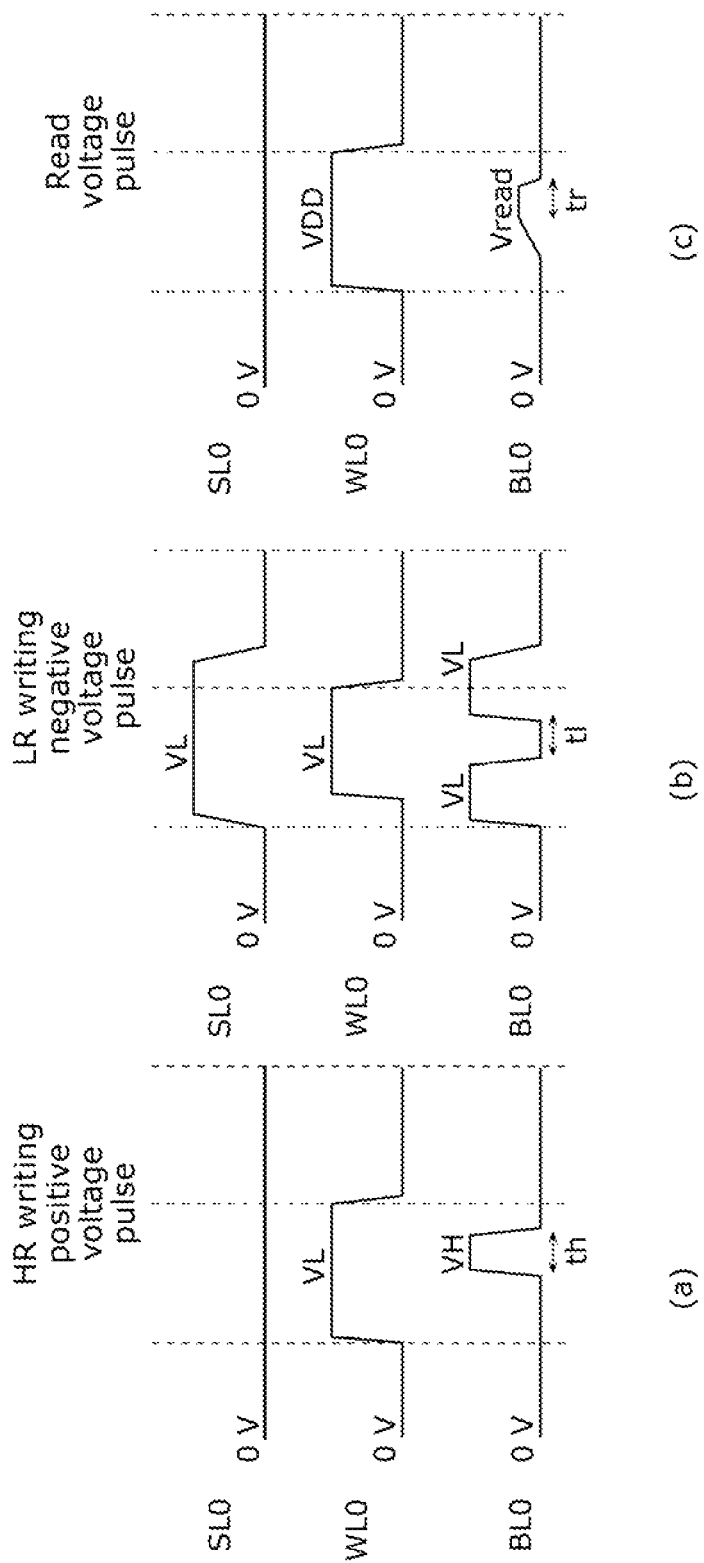

Each of (a) to (c) in FIG. 11 is an operation timing chart for a variable resistance nonvolatile memory device according to an embodiment of the present invention.

[FIG. 12]

Figure 12:
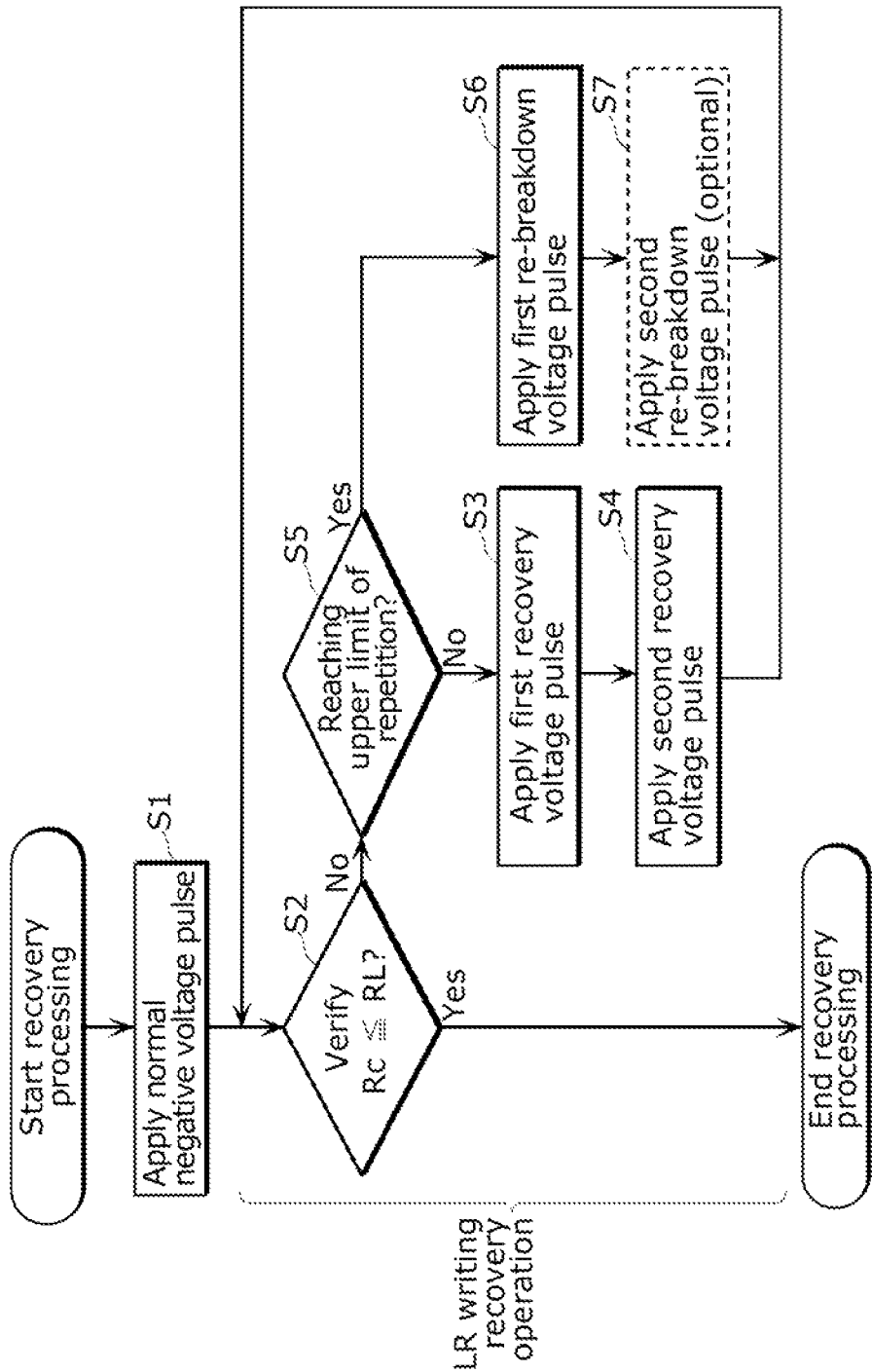

FIG. 12 is a flow chart for HR continuance recovery LR writing in a variable resistance nonvolatile memory device according to an embodiment of the present invention.

[FIG. 13]

Figure 13:
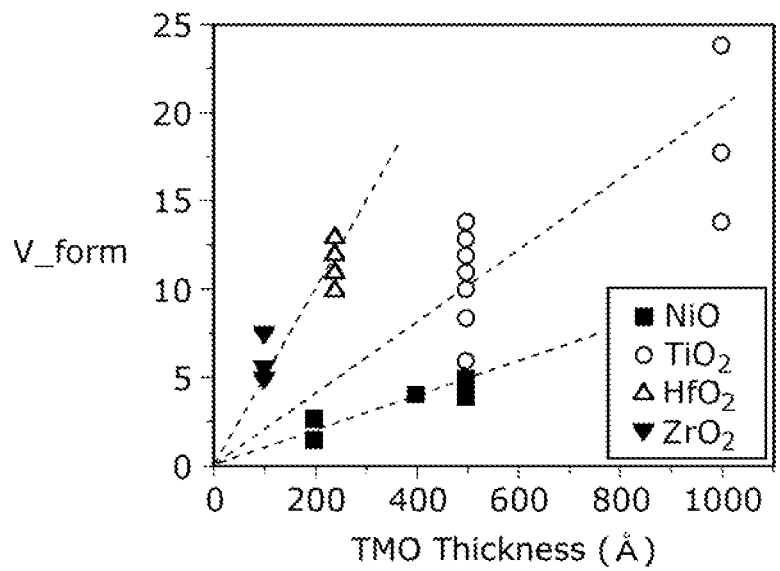

FIG. 13 is a graph showing a dependency of a forming voltage on a transition metal oxide film thickness in a conventional variable resistance nonvolatile memory element.

[FIG. 14]

Figure 14:
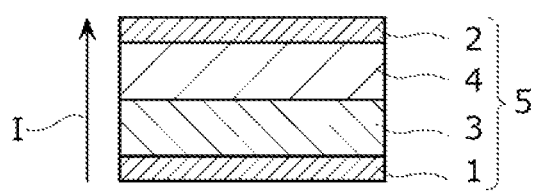

FIG. 14 is a schematic cross-section view of a conventional variable resistance element.

[FIG. 15]

Figure 15:
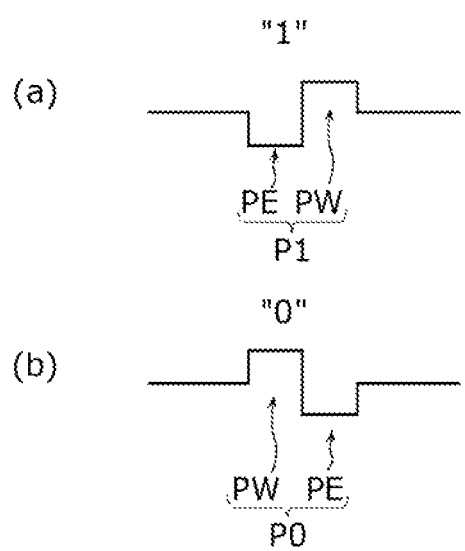

(a) in FIG. 15 is a diagram showing a pulse wave form when conventional programming is performed, and (b) in FIG. 15 is a diagram showing a pulse wave form when conventional erasing is performed.

[FIG. 16]

Figure 16:
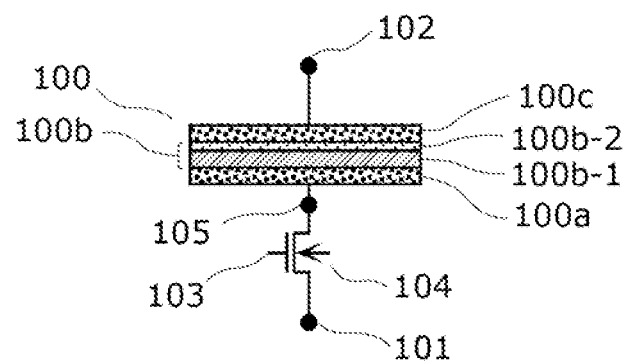

FIG. 16 is a schematic view showing a structure of a 1T1R memory cell using a conventional variable resistance element.

DESCRIPTION OF EMBODIMENTS (Underlying Knowledge Forming Basis of the Present Invention)

The inventors of the present invention have examined, as one of variable resistance nonvolatile memory devices, a variable resistance nonvolatile memory device having memory cells each including a switch element and a variable resistance layer comprising an oxygen-deficient oxide of tantalum (Ta), one of transition metals, (oxide tantalum).

Here, the oxygen-deficient oxide is referred to an oxide that is deficient in oxygen in its stoichiometric composition.

Underlying knowledge for arriving at the present invention and the problems of the conventional techniques are discussed below. First, however, for ease of the discussion, the following explains properties obtained from experiments on a variable resistance element having a variable resistance layer comprising an oxygen-deficient Ta oxide (TaO$_x$, 0<x<2.5). It is to be noted that PTLS 2 and 3 recited in Background Art disclose the properties in detail.

FIG. 16 is a schematic view showing a structure (1-bit structure) of a 1T1R memory cell using a conventional variable resistance element. As shown in FIG. 16, the 1T1R memory cell usually includes an NMOS transistor 104 and a variable resistance element 100.

As is clear from FIG. 16, the variable resistance element 100 is formed by stacking: a lower electrode 100a; a variable resistance layer 100b formed by stacking a first tantalum oxide layer (TaO$_x$, 0<x<2.5) 100b-1 that has a low resistance and comprises an oxygen-deficient Ta oxide, and a second tantalum oxide layer (TaO$_y$, x<y) 100b-2 that has a high resistance; and an upper electrode 100c. A lower electrode terminal 105 is led out from the lower electrode 100a, and an upper electrode terminal 102 is led out from the upper electrode 100c.

Moreover, the NMOS transistor 104, a selection transistor (i.e., an example of the switch element), includes a gate terminal 103. The lower electrode terminal 105 of the variable resistance element 100 and one of source and drain (N$^+$ diffusion) regions of the NMOS transistor 104 are connected in series with each other. The other of the source and drain (N$^+$ diffusion) regions that is not connected to the variable resistance element 100 is led out as a lower electrode terminal 101. A substrate terminal is connected to a ground potential. In the variable resistance element 100, the second tantalum oxide layer 100b-2 that has the high resistance is positioned on the upper electrode 102 side opposite to the NMOS transistor 104.

Here, as disclosed in PTL 3, a relevant patent, examples of a material of the upper electrode 100c include Pt (platinum), Ir (iridium), Pd (palladium), Ag (silver), Ni (nickel), W (tungsten), and Cu (copper).

PTL 3 discloses that a resistance change is likely to occur near an interface with the upper electrode 100c of the variable resistance layer 100b when the upper electrode 100c comprises an electrode material having a standard electrode potential higher than that of Ta, the constituent element of the variable resistance layer 100b, and is not likely to occur near the interface when the upper electrode 100c comprises an electrode material having an standard electrode potential lower than that of Ta, and that the resistance change is more likely to occur with an increase in a difference in standard electrode potential between an electrode material comprised in the upper electrode 100c and a metal comprised in the variable resistance layer 100b, and is less likely to occur with a decrease in the difference.

It is to be noted that the standard electrode potential is generally one index of oxidizability, and a higher standard electrode potential facilitates less oxidation while a lower standard electrode potential facilitates more oxidation. In particular, using Pt or Ir having a high standard electrode potential for an electrode achieves a satisfactory resistance change operation, which is desirable.

Furthermore, in the memory cell shown in FIG. 16, when a voltage (a low resistance writing voltage pulse) higher than or equal to a predetermined voltage (e.g., a first threshold voltage) is applied to the lower electrode terminal 101 with reference to the upper electrode terminal 102, the oxidation occurs near the interface with the upper electrode 100c, and the variable resistance element 100 changes to a low resistance state, whereas when a voltage (a high resistance writing voltage pulse) higher than or equal to another predetermined voltage (e.g., a second threshold voltage) is applied to the upper electrode terminal 102 with reference to the lower electrode terminal 101, the oxidation occurs near the interface with the upper electrode 100c, and the variable resistance element 100 changes to a high resistance state. Here, an application direction of the low resistance writing voltage pulse is defined as a negative voltage direction, and an application direction of the high resistance writing voltage pulse is defined as a positive voltage direction.

The following first describes resistance change characteristics of a 1T1R memory cell including the variable resistance element 100, as shown in FIG. 16, in which the upper electrode 100c comprises Ir (iridium), the lower electrode 100a comprises TaN (tantalum nitride), and the variable resistance layer includes the first tantalum oxide layer 100b-1 (TaO$_x$, 0<x<2.5) and the second tantalum oxide layer 100b-2 (TaO$_y$, x<y), and discusses problems of the resistance change characteristics.

The sample used in the experiments includes: the variable resistance layer 100b having an area of 0.25 μm² (=0.5 μm×0.5 μm); the first tantalum oxide layer 100b-1 (TaO$_x$: x=1.54, film thickness: 30 nm) in contact with the lower electrode 100a; and the second tantalum oxide layer 100b-2 (TaO$_y$: y=2.47, film thickness: 6.5 nm) in contact with the upper electrode 100c. The NMOS transistor 104, the switch element, has a gate width W: 0.44 μm, a gate length L: 0.18 μm, and a gate insulator film thickness Tox: 3.5 nm.

The second tantalum oxide layer 100b-2 (TaO$_y$) is formed by spattering on the first tantalum oxide layer 100b-1 (TaO$_x$) formed by spattering, before the upper electrode 100c is formed. The second tantalum oxide layer 100b-2 (TaO$_x$) has a degree of oxygen deficiency lower than that of the first tantalum oxide layer 100b-1 (TaO$_y$), that is, a structure in which a resistance value is significantly high (>1 MΩ). In order for a resistance change operation to be performed, it is necessary to first apply an initial breakdown voltage for a predetermined period of time to form a conductive path in the second tantalum oxide layer 100b-2.

The degree of oxygen deficiency is referred to a ratio of an amount of deficient oxygen to an amount of oxygen in an oxide of each transition metal having a stoichiometric composition. For instance, when a transition metal is tantalum (Ta), its stoichiometric composition of an oxide is Ta$_2$O$_5$, and thus can be represented by TaO$_{2.5}$. Thus, a degree of oxygen deficiency of TaO$_{2.5}$ is 0%. For example, a degree of oxygen deficiency of an oxygen-deficient tantalum oxide having a composition represented by TaO$_{1.5}$ is calculated as (2.5-1.5)/2.5=40%. Moreover, an oxygen content atomic percentage of Ta$_2$O$_5$ is calculated by a ratio of the number of O atoms to the number of all atoms (O/(Ta+O)), and is 71.4 atm %. Therefore, the oxygen-deficient tantalum oxide has the oxygen content atomic percentage greater than 0 and smaller than 71.4 atm %.

A transition metal other than tantalum may be used for a metal comprised in the variable resistance layer 100b. Examples of the transition metal include tantalum (Ta), titanium (Ti), hafnium (Hf), zirconium (Zr), niobium (Nb), and tungsten (W). The transition metal can be a plurality of kinds of oxide, and thus can achieve different resistance states through oxidation-reduction reaction.

For example, in the case of using hafnium oxide, it has been verified that a resistance value of the variable resistance layer 100b is varied stably and at high speed when a composition of a first hafnium oxide layer 100b-1 is expressed as HfO$_x$ where x is between 0.9 and 1.6 inclusive and a composition of a second hafnium oxide layer 100b-2 is expressed as HfO$_y$, where y is greater than x. In this case, the second hafnium oxide layer 100b-2 has a film thickness from 3 nm to 4 nm, for example.

Moreover, in the case of using zirconium oxide, it has been verified that a resistance value of the variable resistance layer 100b is varied stably and at high speed when a composition of a first zirconium oxide layer 100b-1 is expressed as ZrO$_x$ where x is between 0.9 and 1.4 inclusive and a composition of a second zirconium oxide layer 100b-2 is expressed as ZrO$_y$, where y is greater than x. In this case, the second zirconium oxide layer 100b-2 has a film thickness from 1 nm to 5 nm, for example.

It is to be noted that different transition metals may be used for a first transition metal comprised in a first transition metal oxide layer 100b-1 and a second transition metal comprised in a second transition metal oxide layer 100b-2. In this case, the second transition metal oxide layer 100b-2 has a degree of oxygen deficiency lower than that of the first transition metal oxide layer 100b-1, that is, has a resistance higher than that of the first transition metal oxide layer 100b-1, for example. With such a structure, a voltage applied between the lower electrode 100a and the upper electrode 100c at the time of a resistance change is distributed more to the second transition metal oxide layer 100b-2, which allows oxidation-reduction reaction to easily occur in the second transition metal oxide layer 100b-2.

Moreover, when the first transition metal and the second transition metal comprise different materials, a standard electrode potential of the second transition metal is higher than that of the first transition metal, for example. This is because it is considered that a resistance change phenomenon is caused by a change of a resistance value of the second transition metal oxide layer 100b-2 having a high resistance due to oxidation-reduction reaction occurring in a tiny filament (conductive path) formed in the second transition metal oxide layer 100b-2.

For example, using an oxygen-deficient tantalum oxide and a titanium oxide (TiO$_2$) for the first transition metal oxide layer 100b-1 and the second transition metal oxide layer 100b-2, respectively, achieves a stable resistance change operation. Titan (standard electrode potential=−1.63 eV) is a material having a lower standard electrode potential than that of tantalum (standard electrode potential=−0.6 eV). The higher the standard electrode potential of a material is, the more difficult to oxidize the material is. Using a metal oxide having a standard electrode potential lower than that of the metal comprised in the first transition metal oxide layer 100b-1 for the second transition metal oxide layer allows oxidation-reduction reaction to more easily occur in the second transition metal oxide layer 100-2.

It is considered that a resistance change phenomenon is caused in a variable resistance film having a stack structure including each of the above materials, by a change of a resistance value of the second transition metal oxide layer 100b-2 having a high resistance due to oxidation-reduction reaction occurring in a tiny variable resistance region (filament) formed in the second transition metal oxide layer 100b-2.

To put it another way, it is considered that when a positive voltage is applied to the electrode 100c on the second transition metal oxide layer 100b-2 side with reference to the lower electrode 100a, the resistance of the tiny filament formed in the second transition metal oxide layer 100b-2 increases due to oxidation reaction caused in the tiny filament as oxygen ions in a variable resistance film 106 are pulled toward the second transition metal oxide layer 100b-2 side.

Conversely, it is considered that when a negative voltage is applied to the electrode 100c on the second transition metal oxide layer 100b-2 side with reference to the lower electrode 100a, the resistance of the tiny filament decreases due to reduction reaction caused in the tiny filament as the oxygen ions are pushed toward the first transition metal oxide layer 100b-1.

The upper electrode 100c connected to the second transition metal oxide layer 100b-2 having a lower degree of oxygen deficiency comprises a material such as platinum (Pt) and iridium (Ir) having a standard electrode potential higher than those of a material comprised in the lower electrode 100a and the transition metal comprised in the second transition metal oxide layer 100b-2. With such a structure, the oxidation-reduction reaction selectively occurs in the second transition metal oxide layer 100b-2 near the interface with the upper electrode 100c, which causes a stable resistance change phenomenon.

In the case of driving the variable resistance element 100 thus structured, an external power source applies a voltage satisfying a predetermined condition between the lower electrode 100a and the upper electrode 100c.

Regarding the 1T1R memory cell using the variable resistance element thus structured in FIG. 16, (b) in FIG. 1 shows an example of normal resistance change characteristics when a high resistance (HR) writing voltage pulse 10 (VH) and a low resistance (LR) writing voltage pulse 11 (−VL) shown in (a) in FIG. 1 are repeatedly and alternately applied between the terminals 101 and 102 multiple times, and (c) in FIG. 1 shows an example of abnormal resistance change characteristics when high resistance (HR) state continuance occurs.

Here, a symbol assigned at the end of the term "voltage pulse" indicates a voltage value of the voltage pulse. Hereinafter, a voltage value of a voltage pulse is shown in the same manner as appropriate. Moreover, the terms "high resistance" and "low resistance" may be abbreviated as HR and LR, respectively, unless such abbreviation causes the lack of clarity. In addition, the high resistance (HR) writing voltage pulse 10 and the low resistance (LR) writing voltage pulse 11 are abbreviated as HR writing and LR writing, respectively, in (a) in FIG. 1.

A case of applying a positive voltage to the terminal 102 with respect to the terminal 101 is referred to as positive voltage application, and a case of applying a negative voltage to the terminal 102 with respect to the terminal 101 is referred to as negative voltage application. Moreover, for instance, a positive gate voltage VL having the same absolute value as the LR writing voltage pulse 11 is applied to the gate terminal 103 of the transistor 104 when both the HR writing voltage pulse 10 (VH) and the LR writing voltage pulse 11 (−VL) are applied.

Here, when the HR writing voltage pulse 10 (VH) is applied between the terminals 101 and 102 of the memory cell, VH is almost directly applied across the variable resistance element 100. However, when the LR writing voltage pulse 11 (−VL) is applied between the terminals 101 and 102 of the memory cell, a voltage applied across the variable resistance element 100 is—(VL−Vth) where Vth is a threshold value of the transistor 104, and is reduced by a threshold voltage of the transistor 104. This is because the NMOS transistor 104 is connected to a source follower when the LR writing voltage pulse 11 (−VL) is applied.

In each of (b) and (c) in FIG. 1, the horizontal axis shows a pulse application count, and the vertical axis shows a cell current (a positive read voltage Vread is substantially applied to the variable resistance element 100) in each of the high resistance (HR) state and the low resistance (LR) state when, in the memory cell shown in FIG. 16, a positive gate voltage VG is applied to the gate terminal 103 and the positive read voltage Vread is applied to the upper electrode terminal 102 (and at the same time a ground potential is applied to the lower electrode terminal 101). Here, the application of Vread does not ca use a resistance change.

Each of (b) and (c) in FIG. 1 shows an example of resistance change characteristics when, as shown in (a) in FIG. 1, a positive voltage VH is applied as the HR writing voltage pulse 10 between the terminals 101 and 102 with a predetermined pulse width and a negative voltage −VL is applied as the LR writing voltage pulse 11 between the terminals 101 and 102 with a predetermined pulse width. Here, the gate voltage VL is applied to the gate terminal 103. In addition, VL>VH. However, since the transistor is connected to the source follower when low resistance writing is performed, as a voltage actually applied to the variable resistance element, the voltage VH applied when high resistance writing is performed is higher than the voltage VL−Vth applied when the low resistance writing is performed.

As shown in (b) in FIG. 1, in a normal resistance change operation, a cell current in each of the HR state and the LR state shows a stable value within a relatively narrow range. However, as shown in (c) in FIG. 1, once HR state continuance (a phenomenon in which a HR state remains after a HR writing voltage pulse is applied and a resistance change does not occur even when a LR writing voltage pulse is applied) occurs, the resistance sate subsequently fails to recover as the HR state continues even when the normal HR writing voltage pulse 10 (VH) and LR writing voltage pulse 11 (−VL) shown in (a) in FIG. 1 are repeatedly and alternately applied a predetermined number of times.

As above, the reason why the high resistance state continuance occurs is estimated to be because when the HR writing voltage pulse is applied, more excess oxygen ions are accidentally present in the conductive path formed by the initial breakdown in comparison to a normal HR state. However, it has been found that once the HR state continuance occurs, application of a normal LR writing voltage pulse does not easily make a recovery, and the actual number of programming operations to be performed (an operating life) is reduced.

In view of the above, as a result of keen examination of a method of programming a variable resistance nonvolatile memory element for solving HR state continuance (also referred to as making a low resistance (LR) writing recovery), the inventors of the present invention have found that the HR state continuance can be solved by (i) applying, to a variable resistance element, a recovery voltage pulse having an amplitude greater than an absolute value of a normal write voltage, to remove excessive oxygen ions in a conductive path, so that a function recovery of the conductive path is made or (ii) forming a new conductive path other than the conductive path having excessive oxygen ions and subsequently causing the newly formed conductive path to perform a resistance change operation.

The following first describes basic data concerning the low resistance (LR) writing recovery from HR state continuance state, and then describes an embodiment of the present invention.

(1) LR writing recovery by function recovery of conductive path (b) in FIG. 2 shows an example of LR writing recovery characteristics from a high resistance (HR) continuance state when a first recovery voltage pulse 14 (Vrch) and a second recovery voltage pulse 15 (−Vrcl) shown in (a) in FIG. 2 are repeatedly and alternately applied multiple times between terminals 101 and 102 of a 1T1R memory cell using the variable resistance element shown in FIG. 16, and (c) in FIG. 2 shows an example of pulse resistance change characteristics after the LR writing recovery from the HR continuance state. In (a) in FIG. 2, the first recovery voltage pulse 14 and the second recovery voltage pulse 15 are abbreviated as first recovery and second recovery, respectively.

Here, Vrch>VH and Vrch≥Vrcl. As long as Vrcl is a voltage near VL, Vrcl may be higher or lower than VL. When the first recovery voltage pulse 14 (Vrch) is applied between the terminals 101 and 102 of the memory cell, Vrch is almost directly applied across the variable resistance element 100. However, when the second recovery voltage pulse 15 (−Vrcl) is applied between the terminals 101 and 102 of the memory cell, a voltage applied across the variable resistance element 100 is —(Vrcl−Vth) where Vth is a threshold value of the transistor 104, and is reduced by a threshold voltage of the transistor 104.

The vertical axis and horizontal axis in each of (b) and (c) in FIG. 2 are the same as those in (b) in FIG. 1.

(b) in FIG. 2 shows an example of resistance change characteristics when the first recovery voltage pulse 14 (Vrch) and the second recovery voltage pulse 15 (−Vrcl) are repeatedly and alternately applied with a predetermined pulse width to the memory cell stuck in the high resistance state in (c) in FIG. 1, as shown in (a) in FIG. 2. Vrch is a voltage that is higher than the normal high resistance writing voltage VH and does not practically cause re-breakdown (where a voltage for causing breakdown is Vbrh, Vbrh>Vrch>VH). Here, the gate voltage Vrch is applied to the gate terminal 103.

Here, a voltage pulse set including the first recovery voltage pulse 14 and the second recovery voltage pulse 15 is defined as a recovery voltage pulse. It is to be noted that although the second recovery voltage pulse 15 is the same in magnitude and pulse width as the normal LR writing voltage pulse 11 shown in (a) in FIG. 1 here, the amplitude of the second recovery voltage pulse 15 may be less than that of the LR writing voltage pulse 11 at the time of normal operation, and the pulse width of the second recovery voltage pulse 15 may be also less than that of the LR writing voltage pulse 11 at the time of normal operation.

As shown in (b) in FIG. 2, repeating application of the recovery voltage pulse to the memory cell in the HR continuant state multiple times increases a cell current in an LR state, and thus the memory cell recovers from the HR continuance state. Subsequently, when alternate application of a normal resistance change voltage pulse (the same condition as in (a) in FIG. 1) is performed in which the HR writing voltage pulse 10 (VH) at the time of normal operation is applied to the memory cell with a predetermined pulse width and the LR writing voltage pulse 11 (−VL) at the time of normal operation is applied to the memory cell with a pulse width (Here, VL>VH, and the gate voltage VL is applied to the gate terminal 103 of the transistor.), a resistance change stably occurs without causing again HR continuance, as shown in (c) in FIG. 2.

Each of (a) and (b) in FIG. 3 is a diagram illustrating an estimated mechanism of recovery from HR state continuance by application of a recovery voltage pulse. The same reference signs are assigned to constituent elements in FIG. 3 that are the same as those in FIG. 16, and descriptions thereof are omitted.

In (a) in FIG. 3, the variable resistance element 100 is in a HR continuance state, excessive oxygen ions are present in a filament 113 formed in the second transition metal oxide layer 102*b*-2 in comparison to a normal high resistance state, and a change to the low resistance state does not occur in the filament (conductive path) even when a normal LR writing voltage is applied to the variable resistance element 100, and thus the variable resistance element 100 fails to function.

(b) in FIG. 3 is a schematic view showing that when the recovery voltage pulse is repeatedly applied to the variable resistance element 100 in which the HR continuance has occurred, excessive oxygen ions ($O^{2-}$) in the filament 113 are removed, and the filament 113 recovers to a normal state.

It is to be noted that, as shown in (a) in FIG. 4, when, instead of the first recovery voltage pulse 14 (Vrch) in (a) in FIG. 2, a first positive voltage pulse 16 (Vrch 1, Vrch 1<VH) having a voltage lower than that of the normal HR writing voltage pulse 10 (VH) and a second recovery voltage pulse 15 (−Vrcl) were repeatedly and alternately applied to the variable resistance element 100 in the HR continuance state, the recovery of the resistance change characteristics as seen in (b) in FIG. 2 did not occur. In addition, as shown in (b) in FIG. 4, when only the second recovery voltage pulse 15 (−Vrcl) was repeatedly applied to the variable resistance element 100 in the HR continuance state, or as shown in (c) in FIG. 4, when only the first recovery voltage pulse 14 (Vrch) was repeatedly applied to the variable resistance element 100 in the HR continuance state, the recovery of the resistance change characteristics as seen in (b) in FIG. 2 did not occur.

In summary, the application of the recovery voltage pulse to the memory cell in the HR continuance state in a repetitive manner removes the excessive oxygen ions from the filament to normalize the filament, the application of the recovery voltage pulse including the application of the first recovery voltage pulse 14 (Vrch) that is greater than the normal HR writing voltage pulse 10 (VH) and has a voltage which does not practically cause the re-breakdown of the second transition metal oxide layer 102b-2 and the subsequent application of the second recovery voltage pulse 15 (−Vrcl). As a result, it is considered that the resistance change characteristics are stabilized, and the operating life is significantly extended.

It is to be noted that although the first recovery voltage pulse 14 (Vrch) included in the recovery voltage pulse has the same pulse width as that of the second recovery voltage pulse 15 (−Vrcl) here, the pulse width of the first recovery voltage pulse 14 may be increased more than that of the second recovery voltage pulse 15 so that the effect of recovery from the HR continuance by application of a strong inversion pulse is enhanced.

(2) LR writing recovery by re-breakdown

Regarding the 1T1R memory cell using the variable resistance element shown in FIG. 16, (b) in FIG. 5 shows an example of LR writing recovery characteristics from a high resistance (HR) continuance state when a first re-breakdown voltage pulse 12 (Vbrh, and Vbrh>Vrch>VH) shown in (a) in 5 and a second re-breakdown voltage pulse 13 (−Vbrl) are repeatedly and alternately applied, and (c) in FIG. 5 shows an example of pulse resistance change characteristics after a LR writing recovery from the HR continuance state. In (a) in FIG. 5, the first re-breakdown voltage pulse 12 and the second re-breakdown voltage pulse 13 are abbreviated as a first re-breakdown and a second re-breakdown, respectively.

The vertical axis and horizontal axis in each of (b) and (c) in FIG. 5 are the same as those in (b) in FIG. 1.

(b) in FIG. 5 shows an example of resistance change characteristics when, as shown in (a) in FIG. 5, the second re-breakdown voltage pulse 13 (−Vbrl) is applied after a voltage (Vbrh) that can cause re-breakdown of the second transition metal oxide layer 102b-2 is applied as the first re-breakdown voltage pulse 12 (Vbrh) with a predetermined pulse width. Here, a positive gate voltage Vbrh is applied to the gate terminal 103 of the transistor.

As shown in (b) in FIG. 5, although in the HR continuance state (point A) the memory cell is in a high resistance state that is less than or equal to measurement resolution, the application of the first re-breakdown voltage pulse 12 (Vbrh) causes the re-breakdown of the second transition metal oxide layer 102b-2. Consequently, a conductive path (a filament) is newly formed in the second transition metal oxide layer 102b-2, and the memory cell gets out of the high resistance continuance state (a point B).

Subsequently, when the second re-breakdown voltage pulse 13 (−Vbrl) and the first re-breakdown voltage pulse 12 (Vbrh) are repeatedly and alternately applied, a current cell in a LR state gradually increases and is saturated. Next, when alternate application of a normal resistance change voltage pulse is performed in which the HR writing voltage pulse 10 (VH) at the time of normal operation is applied to the memory cell with a predetermined pulse width and the LR writing voltage pulse 11 (−VL) at the time of normal operation is applied to the memory cell with a predetermined pulse width (here, the gate voltage VL is applied to the gate terminal 103 of the transistor.), a resistance change stably occurs without causing again HR continuance, as shown in (c) in FIG. 5.

It is to be noted that the re-breakdown of the second transition metal oxide layer 102b-2 may be caused only by the initial application of the first re-breakdown voltage pulse 12 (Vbrh). For instance, the initial application of the first re-breakdown voltage pulse 12 (Vbrh) enables the memory cell to get out of the high resistance continuance state (the point B) according to the resistance change characteristics shown in (b) in FIG. 5, and the application of the second re-breakdown voltage pulse 13 (−Vbrl) and the second and subsequent applications of the first re-breakdown voltage pulse 12 are not always necessary.

However, the application of the second re-breakdown voltage pulse 13 or repetition of subsequent (the second and subsequent) applications of the first re-breakdown voltage pulse 12 and the second re-breakdown voltage pulse 13 may cause re-breakdown for the first time or result in more favorable resistance change characteristics. Thus, it is not possible to deny the technical significance of the application of the second re-breakdown voltage pulse 13 and the repetition of the subsequent (the second and subsequent) applications of the first re-breakdown voltage pulse 12 and the second re-breakdown voltage pulse 13.

Each of (a) to (c) in FIG. 6 is a diagram for illustrating an estimation mechanism of a recovery from HR continuance by re-breakdown. The same reference signs are assigned to constituent elements in FIG. 6 that are the same as those in FIG. 16, and descriptions thereof are omitted.

(a) in FIG. 6 shows that the variable resistance element 100 is in the HR continuance state, and the excess oxygen ions are in the filament 110, which prevents the filament (conductive path) from allowing a resistance change and functioning.

(b) in FIG. 6 shows a situation where a filament 111 is newly formed when re-breakdown is performed on the variable resistance element 100 in which the HR continuance has occurred. As shown in (c) in FIG. 6, when the HR continuance occurs also in the filament 111, the next re-breakdown is performed to form another new filament 112. Subsequently, it is possible to recover from the HR continuance by repeating the re-breakdown and the formation of a new filament every time an existing filament is clogged with oxygen ions and the HR continuance occurs.

As above, performing the re-breakdown makes it possible to form the new filament every time the existing filament deteriorates and the HR continuance occurs, and to significantly extend the operating life. Needless to say, the re-breakdown may be performed again on the same filament.

It is to be noted that although the new filament is formed by the application of the positive voltage in the method of performing re-breakdown, obviously the re-breakdown may be performed by the application of the negative voltage.

[Variable Resistance Nonvolatile Memory Device According to the Embodiment of the Present Invention]

The inventors have conceived a nonvolatile memory device that performs a satisfactory LR writing recovery operation on a cell in the HR continuance state, based on the underlying knowledge obtained from the basic data about the LR writing recovery from the HR continuance state. The following describes, as the embodiment of the present invention, a 1T1R nonvolatile memory device using variable resistance elements including the variable resistance element shown in FIG. 16.

FIG. 7 is a block diagram showing a configuration of a variable resistance nonvolatile memory device according to the embodiment of the present invention.

As shown in FIG. 7, a nonvolatile memory device 200 according to this embodiment includes a main memory unit 201 on a semiconductor substrate, and the main memory unit 201 includes: a memory cell array 202 including the 1T1R memory cells each shown in FIG. 16; a row driver 207 including a row selection circuit 208, a word line driver WLD, and a source line driver SW; a column selection circuit 203; a programming circuit 206 that performs breakdown and data writing; a sense amplifier 204 that detects an amount of current flowing in a selected bit line and determines a high resistance state as data "0" and a low resistance state as data "1"; and a data input and output circuit 205 that inputs and outputs input-output data via a terminal DQ.

The nonvolatile memory device 200 further includes, as a programming power source 211, a high resistance (HR) writing power source 213 and a low resistance (LR) writing power source 212.

The nonvolatile memory device 200 still further includes: an address input circuit 209 that receives address signals inputted from an outside; and a control circuit 210 that controls the operation of the main memory unit 201 based on control signals received from the outside.

The memory array 202 includes: word lines WL0, WL1, WL2, WL3, . . . and bit lines BL0, BL1, BL2, . . . that are formed on the semiconductor substrate and arranged to cross with each other; NMOS transistors N11, N12, N13, N14, . . . , N21, N22, N23, N24, . . . , N31, N32, N33, N34, . . . each of which is provided at a corresponding one of cross points of the word lines WL0, WL1, WL2, WL3, . . . and the bit lines BL0, BL1, BL2, . . . (hereinafter, referred to as "transistors N11, N12, . . . "); and variable resistance elements R11, R12, R13, R14, . . . , R21, R22, R23, R24, . . . , R31, R32, R33, R34, . . . that are connected in series to the transistors N11, N12, . . . on a one-to-one basis (hereinafter, referred to as "variable resistance elements R11, R12, . . . "). Each of the sets of the series-connected transistors and variable resistance elements composes a corresponding one of memory cells M11, M12, M13, M14, . . . , M21, M22, M23, M24, . . . , M31, M32, M33, M34, . . . (hereinafter, referred to "memory cells M11, M12, . . . ").

As shown in FIG. 7, the transistors N11, N21, N31, . . . have gates connected to the word line WL0, the transistors N12, N22, N32, . . . have gates connected to the word line WL1, the transistors N13, N23, N33, . . . have gates connected to the word line WL2, and the transistors N14, N24, N34, . . . have gates connected to the word line WL3.

Moreover, the transistors N11, N21, N31, . . . and the transistors N12, N22, N32, . . . are commonly connected to a source line SL0, and the transistors N13, N23, N33, . . . and the transistors N14, N24, N34, . . . are commonly connected to a source line SL2. In other words, source lines SL0, SL2, . . . are parallel to the word lines WL0, WL1, WL2, WL3, . . . , and arranged to cross the bit lines BL0, BL1, BL2, . . . (perpendicularly in this embodiment). It is to be noted that although the source lines are arranged parallel to the word lines in the configuration example, the source lines may be arranged parallel to the bit lines. Moreover, although the source lines each as a plate line provide a common electric potential to the connected transistors, a source line selection circuit and driver having the same structure as the row selection circuit and driver may be provided to drive selected source lines and unselected source lines with different voltages (including polarities).

The variable resistance elements R11, R12, R13, R14, . . . are connected to the bit line BL0, the variable resistance elements R21, R22, R23, R24, . . . are connected to the bit line BL1, and the variable resistance elements R31, R32, R33, R34, . . . are connected to the bit line BL2. As stated above, in this embodiment, the variable resistance elements R11, R21, R31, . . . are directly connected to the corresponding bit lines BL0, BL1, BL2, . . . not via the NMOS transistors N11, N21, N31, . . . in the memory array 202.

At the time of a LR writing recovery operation, the control circuit 210 outputs to the programming circuit 206 a LR writing recovery signal for instructing application of a predetermined recovery voltage. In addition, in a data write cycle, the control circuit 210 outputs to the programming circuit 206 a write command signal for instructing application of a write voltage, according to input data Din received by the data input and output circuit 205. In contrast, in a data reading cycle, the control circuit 210 outputs to the sense amplifier 204 a read signal for instructing a read operation.

The row selection circuit 208 receives row address signals from the address input circuit 209, and causes a word line driver circuit WLD of the row driver 207 to apply a predetermined voltage to a selected one of the word lines WL0, WL1, WL2, WL3, . . . , according to the row address signals, the word line driver circuit WLD corresponding to one of the word lines WL0, WL1, WL2, WL3, . . . .

In the same manner, the row selection circuit 208 receives row address signals from the address input circuit 209, and causes a source line driver circuit SLD of the row driver 207 to apply a predetermined voltage to a selected one of the source lines SL0, SL2, . . . , according to the row address signals, the source line driver circuit SLD corresponding to one of the source lines SL0, SL2, . . . .

When receiving the LR writing recovery signal from the control circuit 210, the programming circuit 206 applies, to one of the hit lines which is selected by the column selection circuit 203, a LR wilting recovery voltage pulse having a predetermined amplitude, with a predetermined pulse width. Moreover, when receiving the write command signal from the control circuit 210, the programming circuit 206 applies, to one of the bit lines which is selected by the column selection circuit 203, a write voltage for normal operation.

The programming power source 211 includes the LR writing power source 212 and the HR writing power source 213. The LR writing power source 212 provides output VL0 to the row driver 207, and the HR writing power source 213 provides output VH0 to the programming circuit 206.

FIG. 8 is a circuit diagram showing an exemplary detailed configuration of the sense amplifier 204 shown in FIG. 7.

The sense amplifier 204 includes: a current mirror circuit 218 having a mirror ratio of 1:1; clamp transistors 219 and 220 each having the same size; a reference circuit 221; and an inverter 224, for instance. The reference circuit 221 includes a normal operation reference current generation circuit 702 and a LR writing verify reference current generation circuit 703.

In the normal operation reference current generation circuit 702, one end of a branch in which a selection transistor 222 and normal reading reference resistance Rref are connected in series with each other is connected a ground potential, and the other end of the same is connected to the source terminal of the clamp transistor 219. A read enable signal C1 is inputted to the gate terminal of the selection transistor 222, and the selection transistor 222 switches between conduction and nonconduction according to the read enable signal C1.

Similarly, in the LR writing verify reference current generation circuit 703, one end of a branch in which a selection transistor 223 and LR writing verify reference resistance RL (RL<Rref) are connected in series with each other is connected to a ground potential, and the other end of the same is connected to the source terminal of the clamp transistor 219. A LR writing verify enable signal C2 is inputted to the gate terminal of the selection transistor 223, and the selection transistor 223 switches between conduction and nonconduction according to the LR writing verify signal C2.

A clamp voltage VCLP (VCLP<VDD) is inputted to the gate terminal of each of the clamp transistors 219 and 220. The clamp transistor 220 has the source terminal connected to the memory cell via the column selection circuit 203 and one of the bit lines, and the clamp transistors 219 and 220 have the drain terminals each connected to a corresponding one of the drain terminals of transistors 225 and 226 included in the current mirror circuit 218. A drain terminal potential of the clamp transistor 220 is inverted and amplified by the inverter 224, and is then transmitted to the data input and output circuit 205 as a sense amplifier output SAO.

FIG. 9 is a diagram illustrating determination levels of the sense amplifier 204. As shown in FIG. 9, the sense amplifier 204 has the following two determination levels between a resistance value=Rhr of a memory cell in the high resistance (HR) state and a resistance value=Rlr of a memory cell in the low resistance (LR) state: (1) normal reading reference resistance Rref (Rlr<Rref<Rhr); and (2) LR writing verify reference resistance RL that is smaller than the normal reading reference resistance (Rlr<RL<Rref).

It is to be noted that to determine whether or not LR writing is already performed on a variable resistance element, the LR writing verify reference resistance RL is set to a resistance value greater than the resistance value in the LR state, and more preferably to a value close to the resistance value in the LR state. In addition, to determine whether the variable resistance element is in the high resistance state or the low resistance state, the normal reading reference resistance Rref is set to a resistance value that is less than the resistance value in the HR state and greater than the resistance value in the LR state.

A resistance value of a memory cell in the high resistance (HR) continuance state is expressed as Rvh (Rvh>Rhr).

[Operation of Variable Resistance Nonvolatile Memory Device According to the Embodiment of the Present Invention]

Regarding the variable resistance nonvolatile memory device thus configured, the following describes first the operation of main circuit blocks, and then the normal operation of the variable resistance nonvolatile memory device, a LR writing recovery operation by function recovery of a conductive path, and a LR writing recovery operation by re-breakdown.

First, the operation of the sense amplifier 204 shown in FIG. 8 is described. In a LR writing step in which LR writing is performed on a variable resistance element, the sense amplifier 204 is connected to a target memory cell via the column selection circuit 203 and one of the bit lines after a LR writing negative voltage pulse is applied to the variable resistance element, and a voltage that is higher than a voltage (VCLP−Vth) obtained by reducing a clamp voltage VCLP by a threshold voltage (Vth) of the clamp transistors 219 and 220 is not applied to the memory cell.

In contrast, in the reference circuit 221, the selection transistor 223 is activated to be conductive according to the LR writing verify enable signal C2, and the LR writing reference resistance RL is selected, while the selection transistor 222 is deactivated to be nonconductive according to the read enable signal C1, and a reference current Iref (=(VCLP−Vth)/RL) flows.

Consequently, the reference current Iref is transferred by the current mirror circuit 218, a current (IL=Iref) that is substantially equal to Iref flows as a load current IL, and the clamp transistor 220 compares the load current IL and a memory cell current Ic to determine the magnitude relationship. The clamp transistor 220 detects whether a drain terminal voltage of the clamp transistor 220 is higher or lower than an inversion voltage (an input threshold voltage) of the inverter 224, depending on the comparison result, and the inverter 224 outputs a sense amplifier output SAO.

Where a resistance value of the variable resistance element after the application of the LR writing negative voltage pulse (−VL) is expressed as Rvh (a resistance value in the HR continuance state, Rvh>Rhr>RL>Rlr), when the memory cell current Ic (=(VCLP−Vth)/Rvh) flows, the load current IL >the memory cell current Ic, the drain terminal voltage of the clamp transistor 220 is higher than the inversion voltage of the inverter 224 after a certain period of time, and the sense amplifier output SAO outputs L level. Stated differently, when a selected memory cell is in the HR continuance state (Rvh) in which resistance is higher than the LR writing reference resistance RL, the sense amplifier 204 determines "0", that is, failure.

On the other hand, in the case where a resistance value of the selected memory cell after the application of the LR writing negative voltage pulse (−VL) is lower than Rlr (<RL) and the LR writing verify reference resistance RL due to either the function recovery of the conductive path or the formation of the new conductive path by re-breakdown, when a memory cell current Ic (=(VCLP−Vth)/Rlr) flows, the load current IL<the memory cell current Ic, the drain terminal voltage of the clamp transistor 220 is lower than the inversion voltage of the inverter 224 after a certain period of time, and the sense amplifier output SAO outputs H level. To put it another way, when the selected memory cell is in a resistance state (Rlr) in which resistance is lower than the LR writing verify reference resistance RL, the sense amplifier 204 determines "1", that is, pass that indicates that the LR writing has been performed on the target memory cell.

Moreover, at the time of normal reading, in the reference circuit 221, the selection transistor 222 is activated to be conductive according to the read enable signal C1, and the normal reading reference resistance Rref is selected, while the selection transistor 223 is deactivated to be nonconductive according to the LR writing enable signal C2, and the reference current Iref (=(VCLP−Vth)/Rref) flows.

Consequently, the reference current Iref is transferred by the current mirror circuit 218, a current (IL=Iref) that is substantially equal to Iref flows as the load current IL, and the clamp transistor 220 compares the load current IL and the memory cell current Ic to determine the magnitude relationship. The clamp transistor 220 detects whether the drain terminal voltage of the clamp transistor 220 is higher or lower than the inversion voltage (the input threshold voltage) of the inverter 224, depending on the comparison result, and the inverter 224 outputs the sense amplifier output SAO.

Where a resistance value of the variable resistance element in the high resistance state is expressed as Rhr and a resistance value of the variable resistance element in the low resistance state is expressed as Rlr (Rhr>Rref>Rlr), when the selected memory cell is in the high resistance state, a current Ic (=(VCLP−Vth)/Rhr) flows. At this time, the load current IL > the memory cell current Ic, the drain terminal voltage of the clamp transistor 220 is higher than the inversion voltage of the inverter 224, and the sense amplifier output SAO outputs L level. Stated differently, when the selected memory cell is in the high resistance state (Rhr) in which resistance is higher than the normal reading reference resistance Rref, the sense amplifier 204 determines "0" data.

On the other hand, when the selected memory cell is in the low resistance state, a memory cell current Ic (=(VCLP−Vth)/Rlr) flows. At this time, the load current IL <the memory cell current Ic, the drain terminal voltage of the clamp transistor 220 is lower than the inversion voltage of the inverter 224, and the sense amplifier output SAO outputs H level. Stated differently, when the selected memory cell is in the low resistance state (Rlr) in which resistance is lower than the normal reading reference resistance Rref, the sense amplifier 204 determines "1" data.

The following describes: the high resistance (HR) writing, the low resistance (LR) writing, and normal reading in the normal operation; the application of the first and second recovery voltage pulses and the LR writing verify reading in the LR writing recovery operation by the function recovery of the conductive path; and the application of the first and second re-breakdown voltage pulses, voltage pulses applied to the memory cell in each operation of reading after re-breakdown, and voltages applied to a word line (WL), a source line (SL), and a bit line (BL) to apply the voltage pulses to the memory cell in the LR writing recovery operation by re-breakdown. As described below, the voltages applied to the word line (WL), the source line (SL), and the bit line (BL) are generated by the LR writing power source 212 and the HR writing power source 213.

In FIG. 10, a normal operation voltage VL is generated by the LR writing power source 212, and is applied from the word line driver circuit WLD to the word line. A normal operation voltage VH is generated by the HR writing power source 213, and is supplied to the programming circuit 206.

In the LR writing recovery operation by the function recovery of the conductive path, a bit line BL voltage at the time of application of the first recovery voltage pulse indicates a voltage pulse having an amplitude Vrch, and a bit line BL voltage at the time of application of the second recovery voltage pulse indicates a voltage pulse having an amplitude −Vrcl. At the time of the application of the second recovery voltage pulse, the voltage Vrcl is generated by the LR writing power source 212, and the word line driver circuit WLD and the source line driver circuit SLD apply the voltage Vrcl to the word line and the source line, respectively. In addition, the voltage Vrcl is generated by the HR writing power source 213, and is applied to the bit line via the programming circuit 206.

In the LR writing recovery operation by re-breakdown, a bit line BL voltage at the time of application of the first re-breakdown voltage pulse indicates a voltage pulse having an amplitude Vbrh, and a bit line BL voltage at the time of application of the second re-breakdown voltage pulse indicates a voltage pulse having an amplitude −Vbrl. At the time of the application of the second re-breakdown voltage pulse, the voltage Vbrl is generated by the LR writing power source 212, and the word line driver circuit WLD and the source line driver circuit SLD apply the voltage Vbrl to the word line and the source line, respectively. In addition, the voltage Vbrl is generated by the HR writing power source 213, and is applied to the bit line via the programming circuit 206.

At the time of the normal reading, LR writing verify reading, and reading after re-breakdown, Vread is a read voltage clamped by the sense amplifier 204, and corresponds to a voltage value adjusted so that read disturb does not occur (i.e., the variable resistance element does not change its resistance state). Moreover, VDD corresponds to a power supply voltage supplied to the nonvolatile memory device 200.

The following describes examples of a data write cycle, a read cycle, and the LR writing recovery operation of the variable resistance nonvolatile memory device thus configured, with reference to (a) to (c) in FIG. 11 and the block diagram of the variable resistance nonvolatile memory device according to the embodiment of the present invention shown in FIG. 7.

Each of (a) to (c) in FIG. 11 is a timing diagram showing an example operation of the nonvolatile memory device according to the embodiment of the present invention. Here, it is defined that a case where a variable resistance layer is in the high resistance state is assigned to data "0" and a case where the variable resistance layer is in the low resistance state is assigned to data "1," and an example operation of the variable resistance layer is described below. The description below is for a case where writing and reading data into and from one memory cell (e.g., the memory cell M11) are performed.

(a) in FIG. 11 is a timing diagram, for the memory cell M11, of a HR writing (data "0" writing) cycle at the time of normal operation. A HR writing positive voltage pulse VH is applied to the memory cell M11 in this cycle.

In the cycle, a selected bit line BLIP and a source line SL0 are first set to 0V. Next, a word line WL0 to be selected is set to a voltage VL (VL>VH), and the NMOS transistor N11 of the selected memory cell M11 shown in FIG. 7 is turned ON.

Then, the selected bit line BIG is set to the voltage VH for a period of time th, and subsequently, a pulse waveform of 0 V is applied. At this stage, the positive pulse VH is applied to the memory cell M11 shown in FIG. 7, writing is performed so that the memory cell M11 changes from the low resistance state to the high resistance state. In other words, memory cells are selected in a row direction by a source line and a word line, and then a positive voltage pulse is applied to variable resistance elements of memory cells selected by the source line, the word line, and a bit line, by applying to a specific bit line a pulse waveform in a positive voltage direction. However, the present invention is not limited to this method.

Also in the LR writing recovery operation, except that different voltages are used, the first recovery voltage pulse or the first re-breakdown voltage pulse, the positive voltage pulse, is applied in the same manner as the above method. In this case, a positive voltage Vrch for the function recovery of the conductive path or a positive voltage Vbrh for causing re-breakdown is applied to the memory cell M11 shown in FIG. 7, and a new filament is formed due to the function recovery of the conductive path or the re-breakdown. Consequently, a resistance value of the memory cell M11 decreases from the HR continuance state, and the memory cell M11 makes a transition to a state where a resistance change of the memory cell M11 is made possible by application of a normal operation driving voltage pulse.

Subsequently, the word line WL0 is set to 0 V, and the data "0" writing at the time of normal operation and the application of either the first recovery voltage pulse or the first re-breakdown voltage pulse at the time of LR writing recovery operation are completed. Here, a voltage is applied to the word line WL0 so that on-resistance of the NMOS transistor N11 is sufficiently low.

In other words, memory cells are selected in a row direction by a source line and a word line, and then a positive voltage pulse is applied to variable resistance elements of memory cells selected by the source line, the word line, and a bit line, by applying to a specific bit line a pulse waveform in a positive voltage direction. However, the present invention is not limited to the above method.

In the LR writing recovery operation, application of the second recovery voltage pulse or the second re-breakdown voltage pulse is continued according to a negative voltage pulse application method shown in (b) in FIG. 11, and further plural repetitions of a set of the application of the positive pulse and the application of the negative pulse allow a transition from the HR continuance state to a state where a resistance change is possible.

(b) in FIG. 11 is a timing diagram, for the memory cell M11, of a LR writing (data "1" writing) cycle at the time of normal operation. A LR writing negative voltage pulse –VL is applied to the memory cell M11 in this cycle.

In the cycle, a selected bit line BL0 and a source line SL0 are first set to 0V. Next, the selected bit line BL0 and the source line SL0 are set to a voltage VL. Although a word line WL0 to be selected is then set to the voltage VL, at this time the NMOS transistor N11 of the selected memory cell M11 shown in FIG. 7 is still in off-state. At this stage, the voltage VL is applied to both the drain terminal and the source terminal of the NMOS transistor N11 shown in FIG. 7, and thus a current does not flow regardless of whether the transistor is ON or OFF.

Next, the selected bit line BL0 is set to 0 V for a period of time tl, and subsequently, a pulse waveform of the voltage VL is applied again. At this stage, a voltage pulse of the LR writing negative voltage (–VL) is applied to the memory cell M11 shown in FIG. 7, and a resistance value of the memory cell M11 changes from high to low. Then, the word line WL0 is set to 0 V, and the application of the LR writing negative voltage pulse in the data "1" writing operation is completed. However, the present invention is not limited to the above method.

Also in the LR writing recovery operation, except that different voltages are used, the second recovery voltage pulse or the second re-breakdown voltage pulse, the negative voltage pulse, is applied in the same manner as the above method. In this case, a negative voltage Vrcl for the function recovery of the conductive path or a negative voltage Vbrl after re-breakdown is applied to the memory cell M11 shown in FIG. 7, and a resistance state of a new filament formed due to the function recovery of the conductive path or the re-breakdown is changed to the low resistance state. Consequently, the memory cell M11 makes a transition to a state where a resistance change of the memory cell M11 is made possible by application of a normal operation driving voltage pulse.

Subsequently, the word line WL0 is set to 0 V, and the data "1" writing at the time of normal operation and the application of either the second recovery voltage pulse or the second re-breakdown voltage pulse at the time of LR writing recovery operation are completed. Here, a voltage is applied to the word line WL0 so that on-resistance of the NMOS transistor N11 is as low as possible.

In other words, memory cells are selected in a row direction by a source line and a word line, and then a negative voltage pulse is applied to variable resistance elements of memory cells selected by the source line, the word line, and a bit line, by applying to a specific bit line a pulse waveform in a negative voltage direction.

in the LR writing recovery operation, as stated above, after the first recovery voltage pulse or the first re-breakdown voltage pulse is applied according to the positive voltage pulse application method shown in (a) in FIG. 11, the second recovery voltage pulse or the second re-breakdown voltage pulse is continuously applied according to the negative voltage pulse application method shown in (b) in FIG. 11, and further plural repetitions of a set of the application of the positive pulse and the application of the negative pulse allow a transition from the HR continuance state to a state where a resistance change is possible.

(c) in FIG. 11 is a timing diagram, for the memory cell M11, of a data reading cycle. In the reading cycle, a selected bit line BL0 and a source line SL0 are first set to 0 V. Next, a word line WL0 to be selected is set to a voltage VDD (VDD>Vread), and the NMOS transistor N11 of the selected memory cell M11 is turned ON.

Then, the selected bit line BL0 is set to the read voltage Vread for a period of time tr, and the sense amplifier 204 detects a current value of a current flowing through the selected memory cell M11, to determine whether data stored therein is the data "0" or the data "1." Subsequently, the word line WL0 is set to 0 V, and the data read operation is completed.

Regarding the read operation, except that the sense amplifier 204 uses the read reference resistance at the time of normal operation and the LR writing verify reference resistance at the time of LR writing recovery operation (both the function recovery of the conductive path and the re-breakdown), the reading method shown in (c) in FIG. 11 is employed at the time of normal operation and at the time of LR writing recovery operation. However, it is not necessary to perform the read operation at the time of LR writing recovery operation every time the positive pulse and the negative pulse are applied.

The following describes an example of the LR writing recovery operation in the variable resistance nonvolatile memory device, with reference to a flow chart shown in FIG. 12. As shown in FIG. 12, when it is desired to perform low resistance (LR) writing on a memory cell (hereinafter, a selected memory cell) that is in the high resistance (HR) state and corresponds to selection addresses, a normal LR writing voltage pulse (–VL) is applied to the selected memory cell (51), and then LR writing verify reading is performed in which it is determined whether or not a resistance value Rc of the selected memory cell is less than or equal to reference resistance RL (Rc≤RL) (S2). Here, when it is determined that the resistance value Rc of the selected memory cell is less than or equal to the reference resistance RL (Rc≤RL) (Yes in S2), it is determined that HR continuance has not occurred and the LR writing has been properly completed. In contrast, when it is determined that the resistance value Rc of the selected memory cell is greater than the reference resistance RL (Rc≥RL) (No in S29, it is determined that the HR continuance has occurred, and the LR writing recovery operation is performed. Here, the LR writing recovery operation includes a re-breakdown operation.

In the LR writing recovery operation, the first recovery voltage pulse (Vrch) is applied to the selected memory cell (S3), and then the LR writing verify reading is performed again (S2) after the second recovery voltage pulse (−Vrcl) is applied to the selected memory cell (S4). Such processing is repeated until it is verified that the LR writing has been completed (Yes in S2) or a predetermined upper limit of the repetition is reached (No in S5).

When the processing is performed up to the upper limit of the repetition without completing the LR writing (Yes in S5), re-breakdown is performed by application of the first re-breakdown voltage pulse (Vbrh) (S6) and application of the second re-breakdown voltage pulse (−Vbrl) (S7), to achieve a LR writing recovery. The steps S6 and S7 may be repeated a predetermined number of times. Moreover, as stated above, the step S7 may be skipped in consideration of a case where the re-breakdown is caused by only the application of the first re-breakdown voltage pulse (Vbrh), and the re-breakdown may be performed in only the step S6.

It is to be noted that when the LR writing recovery of the selected memory cell is not achieved by the re-breakdown, it may be determined that the memory cell is irrecoverable, and measures such as a well-known substitute process (e.g., a redundancy process and an error correction process) may be taken.

Here, the steps S1, S4, and S7 correspond to the timing diagram shown in (b) in FIG. 11, the steps S3 and S5 correspond to the timing diagram shown in (a) in FIG. 11, and the step S2 corresponds to the timing diagram shown in (c) in FIG. 11.

As above, a defect due to the HR continuance can be removed by the LR writing recovery operation for solving the HR continuance state according to this embodiment, which makes it possible to significantly stabilize the resistance change operation of the memory array and extend the operating life.

It is to be noted that although the memory device shown in FIG. 7 includes the so-called 1T1R memory cells in each of which one variable resistance element is connected to the NMOS transistor, the switch element, the present invention is not limited to the 1T1R memory cells. For instance, the present invention may be applied to a 1D1R memory cell using, as a switch element, a bidirectional diode.

Those skilled in the art will readily appreciate that various modifications may be made in the embodiment or a method of programming a variable resistance nonvolatile memory element may be realized by arbitrarily combining the constituent elements of the embodiment without materially departing from the novel teachings and advantages of the present invention. Accordingly, all such modifications are included within the scope of the present invention.

[Industrial Applicability]

The present invention is useful, as a method of programming a variable resistance nonvolatile memory element, for achieving a highly-reliable memory used in an electronic device such as a cellular phone and a notebook computer, especially because the method enables: programming with a voltage within a practical voltage range in a variable resistance nonvolatile memory device including memory cells each including a switch element such as a transistor and a variable resistance element whose resistance value reversibly changes based on electrical signals; and an increase in the actual number of programming operations to be performed in the nonvolatile memory device.

REFERENCE SIGNS LIST 1, 2 Electrode
3 Conductive film
4 Insulator film
5 Variable resistance element
10 High resistance (HR) writing voltage pulse
11 Low resistance (LR) writing voltage pulse
12 First re-breakdown voltage pulse
13 Second re-breakdown voltage pulse
14 First recovery voltage pulse
15 Second recovery voltage pulse
16 First recovery voltage pulse (insufficient voltage)
100 Variable resistance element
100a Lower electrode
100b Variable resistance layer
100b-1 First tantalum oxide layer
100b-2 Second tantalum oxide layer
100c Upper electrode
101, 105 Lower electrode terminal
102 Upper electrode terminal
103 Gate terminal
104 NMOS transistor
110, 111, 112, 112 Filament
200 Nonvolatile memory device
201 Main memory unit
202 Memory array
203 Column selection circuit
204 Sense amplifier
205 Data input and output circuit
206 Programming circuit
207 Row driver
208 Row selection circuit
209 Address input circuit
210 Control circuit
211 Programming power source
212 Low resistance (LR) writing power source
213 High resistance (HR) writing power source
218 Current mirror circuit
219, 220 Clamp transistor
221 Reference circuit
222, 223 Selection transistor
224 inverter
225, 226 Transistor
702 Normal operation reference current generation circuit
703 LR writing verify reference current generation circuit

The invention claimed is:

1. A method of programming a variable resistance nonvolatile memory element, the method of programming reversibly changing, by applying a voltage pulse to the variable resistance nonvolatile memory element, a resistance state of the variable resistance nonvolatile memory element, wherein the variable resistance nonvolatile memory element includes: a first electrode; a second electrode; and an oxygen-deficient transition metal oxide layer provided between the first and second electrodes, the transition metal oxide layer includes: a first transition metal oxide layer that is in contact with the first electrode; and a second transition metal oxide layer that is in contact with the second electrode and has a degree of oxygen deficiency lower than a degree of oxygen deficiency of the first transition metal oxide layer, and after the variable resistance nonvolatile memory element is manufactured and an initial breakdown voltage pulse having a predetermined amplitude is applied between the first and second electrodes, the variable resistance nonvolatile memory element has characteristics of (i) changing to a low resistance state when a low resistance writing voltage pulse for providing a negative electric potential to the second electrode with respect to the first electrode is applied, and (ii) changing to a high resistance state when a high resistance writing voltage pulse for providing a positive electric potential to the second electrode with respect to the first electrode is applied, the high resistance state being higher in resistance value than the low resistance state, the method of programming comprising, in the case where the variable resistance nonvolatile memory element cannot change to the low resistance state and remains in the high resistance state when the low resistance writing voltage pulse is applied to the variable resistance nonvolatile memory element, applying a recovery voltage pulse to the variable resistance nonvolatile memory element at least once, the recovery voltage pulse including: a first recovery voltage pulse that has an amplitude greater than an amplitude of the high resistance writing voltage pulse and provides the positive electric potential to the second electrode with respect to the first electrode; and a second recovery voltage pulse that follows the first recovery voltage pulse and provides the negative electric potential to the second electrode with respect to the first electrode.

2. The method of programming a variable resistance nonvolatile memory element according to claim 1, comprising:

determining whether or not the variable resistance nonvolatile memory element has changed to the low resistance state by the application of the second recovery voltage pulse; and repeating the applying of a recovery voltage pulse and the determining until the variable resistance nonvolatile memory element changes to the low resistance state.

3. The method of programming a variable resistance nonvolatile memory element according to claim 2, comprising applying a first re-breakdown voltage pulse to the variable resistance nonvolatile memory element at least once when the variable resistance nonvolatile memory element does not change to the low resistance state even after the applying of a recovery voltage pulse and the determining are repeated a predetermined number of times, the first re-breakdown voltage pulse having an amplitude greater than an amplitude of the first recovery voltage pulse.

4. The method of programming a variable resistance nonvolatile memory element according to claim 2, comprising applying a breakdown voltage pulse to the variable resistance nonvolatile memory element at least once when the variable resistance nonvolatile memory element does not change to the low resistance state even after the applying of a recovery voltage pulse and the determining are repeated a predetermined number of times, the breakdown voltage pulse including: a first re-breakdown voltage pulse that has an amplitude greater than an amplitude of the first recovery voltage pulse; and a second re-breakdown voltage pulse that follows the first re-breakdown voltage pulse and provides the negative electric potential to the second electrode with respect to the first electrode.

5. The method of programming a variable resistance nonvolatile memory element according to claim 1, wherein the second recovery voltage pulse has an amplitude less than or equal to an amplitude of the low resistance writing voltage pulse.

6. The method of programming a variable resistance nonvolatile memory element according to claim 1, wherein the first recovery voltage pulse has a pulse width greater than a pulse width of the second recovery voltage pulse.

7. The method of programming a variable resistance nonvolatile memory element according to claim 1, wherein the first transition metal oxide layer is a layer having a composition expressed as $TaO_x$, and the second transition metal oxide layer is a layer having a composition expressed as $TaO_y$, where x<y.

8. A variable resistance nonvolatile memory device comprising:

a variable resistance nonvolatile memory element including: a first electrode; a second electrode; and an oxygen-deficient transition metal oxide layer provided between the first and second electrodes; and a drive circuit, wherein the transition metal oxide layer includes: a first transition metal oxide layer that is in contact with the first electrode; and a second transition metal oxide layer that is in contact with the second electrode and has a degree of oxygen deficiency lower than a degree of degree of oxygen deficiency of the first transition metal oxide layer, after the variable resistance nonvolatile memory element is manufactured and an initial breakdown voltage pulse having a predetermined amplitude is applied between the first and second electrodes, the variable resistance nonvolatile memory element has characteristics of (i) changing to a low resistance state when a low resistance writing voltage pulse for providing a negative electric potential to the second electrode with respect to the first electrode is applied, and (ii) changing to a high resistance state when a high resistance writing voltage pulse for providing a positive electric potential to the second electrode with respect to the first electrode is applied, the high resistance state being higher in resistance value than the low resistance state, and in the case where the variable resistance nonvolatile memory element cannot change to the low resistance state and remains in the high resistance state when the low resistance writing voltage pulse is applied to the variable resistance nonvolatile memory element, the drive circuit applies a recovery voltage pulse to the variable resistance nonvolatile memory element at least once, the recovery voltage pulse including: a first recovery voltage pulse that has an amplitude greater than an amplitude of the high resistance writing voltage pulse and provides the positive electric potential to the second electrode with respect to the first electrode; and a second recovery voltage pulse that follows the first recovery voltage pulse and provides the negative electric potential to the second electrode with respect to the first electrode.

9. The variable resistance nonvolatile memory device according to claim 8, wherein the drive circuit determines whether or not the variable resistance nonvolatile memory element has changed to the low resistance state by the application of the second recovery voltage pulse, and repeats the application of the recovery voltage pulse and the determination until the variable resistance nonvolatile memory element changes to the low resistance state.

10. The variable resistance nonvolatile memory device according to claim 9, wherein the drive circuit applies a first re-breakdown voltage pulse to the variable resistance nonvolatile memory element at least once when the variable resistance nonvolatile memory element does not change to the low resistance state even after the application of the recovery voltage pulse and the determination are repeated a predetermined number of times, the first re-breakdown voltage pulse having an amplitude greater than an amplitude of the first recovery voltage pulse.

11. The variable resistance nonvolatile memory device according to claim 9,
wherein the drive circuit applies a breakdown voltage pulse to the variable resistance nonvolatile memory element at least once when the variable resistance nonvolatile memory element does not change to the low resistance state even after the application of the recovery voltage pulse and the determination are repeated a predetermined number of times, the breakdown voltage pulse including: a first re-breakdown voltage pulse that has an amplitude greater than an amplitude of the first recovery voltage pulse; and a second re-breakdown voltage pulse that follows the first re-breakdown voltage pulse and provides the negative electric potential to the second electrode with respect to the first electrode.

12. The variable resistance nonvolatile memory device according to claim 8,
wherein the drive circuit applies, as the second recovery voltage pulse, a voltage pulse having an amplitude less than or equal to an amplitude of the low resistance writing voltage pulse, to the variable resistance nonvolatile memory element.

13. The variable resistance nonvolatile memory device according to claim 8,
wherein the drive circuit applies, as the first recovery voltage pulse, a voltage pulse having a pulse width greater than a pulse width of the second recovery voltage pulse, to the variable resistance nonvolatile memory element.

14. The variable resistance nonvolatile memory device according to claim 8,
wherein the first transition metal oxide layer is a layer having a composition expressed as $TaO_x$, and
the second transition metal oxide layer is a layer having a composition expressed as $TaO_y$ where $x<y$.

* * * * *